(12) United States Patent
Ishikawa et al.

(10) Patent No.: US 10,352,808 B2
(45) Date of Patent: Jul. 16, 2019

(54) PRESSURE DETECTION UNIT

(71) Applicant: Kabushiki Kaisha Saginomiya Seisakusho, Tokyo (JP)

(72) Inventors: Takuro Ishikawa, Sayama (JP); Kazuya Takimoto, Sayama (JP); Kazunori Ishibashi, Sayama (JP); Hideaki Koga, Sayama (JP); Takahiro Kobayashi, Tokorozawa (JP)

(73) Assignee: KABUSHIKI KAISHA SAGINOMIYA SEISAKUSHO, Tokyo (JP)

( * ) Notice: Subject to any disclaimer, the term of this patent is extended or adjusted under 35 U.S.C. 154(b) by 0 days.

(21) Appl. No.: 14/765,890

(22) PCT Filed: Dec. 12, 2013

(86) PCT No.: PCT/JP2013/083351
§ 371 (c)(1),
(2) Date: Nov. 12, 2015

(87) PCT Pub. No.: WO2014/122855
PCT Pub. Date: Aug. 14, 2014

(65) Prior Publication Data
US 2016/0069765 A1  Mar. 10, 2016

(30) Foreign Application Priority Data

Feb. 5, 2013  (JP) ................................ 2013-020345

(51) Int. Cl.
*G01L 9/00* (2006.01)
*G01L 19/06* (2006.01)
*G01L 19/14* (2006.01)

(52) U.S. Cl.
CPC ............ *G01L 19/14* (2013.01); *G01L 9/0051* (2013.01); *G01L 19/0654* (2013.01); *G01L 19/142* (2013.01); *H01L 2224/48091* (2013.01)

(58) Field of Classification Search
CPC .................... G01D 11/245; G01L 19/0084
(Continued)

(56) References Cited

U.S. PATENT DOCUMENTS

| | | | |
|---|---|---|---|
| 5,333,505 | A | 8/1994 | Takahashi et al. |
| 2004/0028894 | A1 | 2/2004 | Ueno et al. |

(Continued)

FOREIGN PATENT DOCUMENTS

| | | |
|---|---|---|
| CN | 1284163 A | 2/2001 |
| CN | 1480719 A | 3/2004 |

(Continued)

OTHER PUBLICATIONS

CN Office Action for CN Application No. 2013800690710 dated Aug. 23, 2016 (13 pages).

(Continued)

*Primary Examiner* — Jamel E Williams
(74) *Attorney, Agent, or Firm* — Reising Ethington P.C.

(57) ABSTRACT

Provided is a pressure detection unit in which a waterproof property can be improved. In a pressure sensor, a sealing-resin portion is joined to an outside side surface of an element main body made of stainless steel, aluminum, or nickel such that the sealing-resin portion surrounds a plurality of lead pins. In the pressure sensor, a roughened annular surface portion is provided at a region where the sealing-resin portion is joined on an upper end surface of the element main body so as to be disposed in a manner to partition an external peripheral edge and an internal peripheral edge arranged at the outside side surface of an element main body in the sealing-resin portion.

4 Claims, 21 Drawing Sheets

(58) Field of Classification Search
USPC .......................................................... 73/431
See application file for complete search history.

(56) References Cited

U.S. PATENT DOCUMENTS

2006/0075821 A1* 4/2006 Otsuka ................ G01L 19/0084
   73/715
2009/0218660 A1* 9/2009 Utsumi .............. B23K 26/0057
   257/620

FOREIGN PATENT DOCUMENTS

| CN | 1904566 A | | 1/2007 | |
|---|---|---|---|---|
| EP | 0552017 A2 | | 7/1993 | |
| JP | 60133339 A | * | 7/1985 | ............ G01L 23/22 |
| JP | S60133339 | | 7/1985 | |
| JP | 05299671 A | * | 11/1993 | |
| JP | H05299671 | | 11/1993 | |
| JP | 2004069564 | | 3/2004 | |
| JP | 2004069564 A | * | 3/2004 | |
| JP | 2008225420 | | 9/2008 | |
| JP | 2012068105 | | 4/2012 | |

OTHER PUBLICATIONS

Written Opinion & International Search Report for PCT/JP2013/083351 dated Jan. 21, 2014, 9 pages.

* cited by examiner

PRESSURE DETECTION UNIT

TECHNICAL FIELD

The present invention relates, for example, to a pressure detection unit constituting those such as pressure sensors, pressure switches or the like, and particularly relates to a pressure detection unit for which a waterproof property is required.

Conventionally, as for a pressure detection unit, those such as disclosed in Patent Literature 1 are known, for example. A pressure sensor 800 as a pressure detection unit described in Patent Literature 1 is comprised of, as illustrated in FIG. 21, a pressure detection element 810 made of stainless steel that is configured to sandwich a diaphragm 803 between a base 801 and a receiving member 802 as a fluid pipe connection member, a cover 840 accommodating the pressure detection element 810, and a first adhesive 851 and a second adhesive 852 for fixing the pressure detection element 810 at an inside of the cover 840.

The pressure detection element 810 is provided with a pressure detection device 841 thereinside. A plurality of terminals of the pressure detection device 841 is electrically connected to a plurality of lead pins 843 perpetrating through the base 801 of the pressure detection element 810. Thus, an output of the pressure detection device 841 is extracted to an outside of the pressure detection element 810 through the plurality of lead pins 843, and further, the output thereof is extracted to the outside of the pressure sensor 800 via a substrate 845, a connector 846 and a lead wire 847 connected to the plurality of lead pins 843.

Further, the first adhesive 851 and the second adhesive 852 are provided on an outside side surface of the pressure detection element 810 in intimate contact therewith, thereby, an intrusion of moisture to the boundary face between the pressure detection element 810, and the first adhesive 851 and the second adhesive 852 is prevented so as to ensure a waterproof property thereof.

CITATION LIST

Patent Literature

Patent Literature 1: JP 2012-68105 A

SUMMARY OF INVENTION

Technical Problem

However, such pressure sensor 800, since the pressure detection element 810 is made of stainless steel, has a low water resistance property (specifically, a difficulty of intrusion of moisture to the boundary face) at the boundary face with respect to the adhesive. Thus, a gradual moisture intrusion to the aforementioned boundary face from the peripheral edge of the second adhesive 852 located on the outside side surface of the receiving member 802 could take place. As a result, in the pressure sensor 800, the moisture intruded to the boundary face may reach to the plurality of lead pins 843 along the aforementioned boundary face and may cause a malfunction due to a short circuit among the plurality of lead pins 843 and a corrosion of the plurality of lead pins 843. Thus, there has been a room for improvement with respect to a waterproof property thereof.

In view thereof, the present invention aims to solve the above objectives. That is, the present invention aims at providing a pressure detection unit capable of improving a waterproof property.

Solution to Problem

In order to achieve the above objectives, a first aspect of the present invention provides a pressure detection unit comprising: (a) a pressure detection element comprised of a case made of stainless steel, aluminum or nickel, an insulating member provided in the case and sealing an one or more through-hole(s) penetrating an inside and an outside of the case, a pressure detection device provided inside of the case, and a plurality of lead pins electrically connected to terminals of the pressure detection device and provided in the through-hole(s) in a manner penetrating the insulating member; and (b) an adhesive joined to an outside side surface of the case in a manner surrounding the plurality of lead pins, wherein a roughened annular surface portion partitioning an external peripheral edge and an internal peripheral edge located on the outside side surface of the case in the adhesive is formed by using a laser irradiation at a region where the adhesive is joined on the outside side surface of the case.

In order to achieve the above objectives, a second aspect of the present invention provides a pressure detection unit comprising: (a) a pressure detection element comprised of a case made of stainless steel, aluminum or nickel, an insulating member provided in the case and sealing an one or more through-hole(s) penetrating an inside and an outside of the case, a pressure detection device provided inside of the case, and a plurality of lead pins electrically connected to terminals of the pressure detection device and provided in the through-hole(s) in a manner penetrating the insulating member; and (b) an adhesive joined to an outside side surface of the case in a manner surrounding the plurality of lead pins, wherein a roughened annular surface portion partitioning the plurality of lead pins and a peripheral edge located on the outside side surface of the case in the adhesive is formed by using a laser irradiation at a region where the adhesive is joined on the outside side surface of the case.

In order to achieve the above objectives, a third aspect of the present invention provides a pressure detection unit comprising: (a) a pressure detection element comprised of a case made of stainless steel, aluminum or nickel, an insulating member provided in the case and sealing an one or more through-hole(s) penetrating an inside and an outside of the case, a pressure detection device provided inside of the case, and a plurality of lead pins electrically connected to terminals of the pressure detection device and provided in a manner penetrating the insulating member in the through-hole(s); (b) a cover cylindrically formed and made of copper, copper alloy, or synthetic resin and accommodating the pressure detection element with the plurality of lead pins being directed to an inside of the cylindrical shape in a manner closing an end portion of the cover; and (c) an adhesive provided over an entire circumference between the case and an one end portion of the cover and respectively joined to the case and the one end portion of the cover so as to seal therebetween, wherein a roughened annular surface portion partitioning the plurality of lead pins and a peripheral edge located on an outside side surface of the case in the adhesive and located at the outside of the case is formed by using a laser irradiation at a region where the adhesive is joined on the outside side surface of the case.

A first preferred aspect of the present invention provides the pressure detection unit according to any one of the first aspect to the third aspect of the present invention, wherein the roughened surface portion is configured with a plurality of grooves formed by performing laser scanning in plural times.

A second preferred aspect of the present invention provides the pressure detection unit according to the first preferred aspect of the present invention, wherein the grooves are formed linearly in parallel to each other.

A third preferred aspect of the present invention provides the pressure detection unit according to the first preferred aspect of the present invention, wherein the grooves are respectively formed in an annular and concentric shape without intersecting with each other.

A fourth preferred aspect of the present invention provides a pressure detection unit according to the first preferred aspect of the present invention, wherein the plurality of grooves are comprised of a first plurality of groove portions formed linearly in parallel to each other and a second plurality of groove portions formed linearly in parallel to each other in a direction intersecting with the first plurality of groove portions.

Advantageous Effects of Invention

According to the first aspect of the present invention, an adhesive is joined to the outside side surface of the case made of stainless steel, aluminum or nickel in a manner surrounding the plurality of lead pins, and a roughened annular surface portion partitioning an external peripheral edge and an internal peripheral edge located on the outside side surface of the case in the adhesive is formed by using a laser irradiation at a region where the adhesive is joined on an outside side surface of the case. Hence, the moisture having intruded to the boundary face between the case and the adhesive from the outer peripheral edge located on the outside side surface of the case in the adhesive must pass through the roughened surface portion in order to reach the plurality of lead pins. Then, in the roughened surface portion, the adhesive enters into recesses formed by the roughening by a laser irradiation, thereby, the adherence property between the case and the adhesive is improved, a water-resistance property at the boundary face between the roughened surface portion of the case and the adhesive is enhanced. Thus, in the roughened surface portion, the moisture is prevented from passing therethrough and the moisture is restrained from reaching the plurality of lead pins, thereby enabling an enhancement of a waterproof property thereof. Moreover, since the roughened surface portion is formed by a laser irradiation, as compared to the cases of forming the roughened surface portion by such methods as plasma cleaning or UV radiation for example, the roughened surface portion can be easily formed to a desired shape. Thus, an annular roughened surface portion can be easily provided.

According to the second aspect of the present invention, an adhesive is joined to the outside surface of the case made of stainless steel, aluminum or nickel in a manner surrounding the plurality of lead pins, and a roughened annular surface portion partitioning the plurality of lead pins and a peripheral edge located on the outside side surface of the case in the adhesive is formed by using a laser irradiation at a region where the adhesive is joined on an outside side surface of the case. Thus, the moisture having intruded to the boundary face between the case and the adhesive from the peripheral edge located on the outside side surface of the case in the adhesive must pass through the roughened surface portion in order to reach the plurality of lead pins. Then, in the roughened surface portion, the adhesive enters into recesses formed by the roughening by a laser irradiation, thereby the adherence property between the case and the adhesive is improved, and a water-resistance property at the boundary face between the roughened surface portion of the case and the adhesive is enhanced. Thus, in the roughened surface portion, the moisture is prevented from passing therethrough and the moisture is restrained from reaching the plurality of lead pins, thereby enabling an enhancement of a waterproof property thereof. Moreover, since the roughened surface portion is formed by a laser irradiation, the roughened surface portion can be easily formed to a desired shape as compared to the case of forming the roughened surface portion by such methods as plasma cleaning or UV radiation, for example. Hence, the annular roughened surface portion can be easily provided.

According to the third aspect of the present invention, the pressure detection element is accommodated in the cover cylindrically formed and made of copper, copper alloy, or synthetic resin with the plurality of lead pins being directed to an inside of the cylindrical shape in a manner closing an end portion of the cover. Also, an adhesive is provided over the entire circumference between the case and the one end portion of the cover and is respectively joined to the case and the one end portion of the cover so as to seal therebetween. Further, a roughened annular surface portion partitioning a plurality of lead pins and a peripheral edge located on an outside side surface of the case in the adhesive and located at an outside of the cover is formed by using a laser irradiation at a region where the adhesive is joined on the outside side surface of the case. Thus, the moisture having intruded to the boundary face between the case and the adhesive from the peripheral edge located on the outside side surface of the case in the adhesive and located in the outside of the cover must pass through the roughened surface portion in order to reach the plurality of lead pins. Then, in the roughened surface portion, the adhesive enters into recesses formed by the roughening by a laser irradiation, thus, the adherence property between the case and the adhesive is improved, thereby, the water-resistance property at the boundary face between the roughened surface portion of the case and the adhesive is enhanced. Thus, in the roughened surface portion, the moisture is prevented from passing therethrough and the moisture is restrained from reaching the plurality of lead pins, thereby enabling an enhancement of a waterproof property thereof. Moreover, since the roughened surface portion is formed by a laser irradiation, the roughened surface portion can be easily formed to a desired shape as compared to a case of forming the roughened surface portion by such methods as plasma cleaning or UV radiation, for example. Hence, the annular roughened surface portion can be easily provided.

According to the first preferred aspect of the present invention, the roughened surface portion is configured with a plurality of grooves formed by performing laser scanning in plural times. Thus, the roughened surface portion can be more easily formed by using a simple laser control as compared to a laser control in which an intermittent laser irradiation is performed.

According to the second preferred aspect of the present invention, the grooves in the roughened surface portion are formed linearly in parallel to each other. Thus, the roughened surface portion can be more easily formed by using very simple laser control as compared to laser controls in which an intermittent laser irradiation or a laser irradiation in a curvature manner is performed.

According to the third preferred aspect of the present invention, the grooves in the roughened surface portion are respectively formed in an annular and concentric shape without intersecting with each other. Thus, the plurality of grooves serves as moats that oppose the moisture having intruded to the boundary face between the case and the adhesive multiple times, to further restrain the moisture from reaching the plurality of lead pins, thereby further enabling an enhancement of a waterproof property thereof.

According to the fourth preferred aspect of the present invention, the plurality of grooves in the roughened surface portion is comprised of a first plurality of groove portions formed linearly in parallel to each other and a second plurality of groove portions formed linearly in parallel to each other in a direction intersecting with the first plurality of groove portions. Thus, the roughened surface portion having more improved waterproof function can be more easily formed by using a simple laser control as compared to a laser control in which an intermittent laser irradiation is performed.

BRIEF DESCRIPTION OF DRAWINGS

FIG. 3A is a plan view, and FIG. 3B is a partially enlarged view of a roughened surface portion in FIG. 3A (the roughened surface portion is configured with a plurality of grooves formed linearly in parallel to each other on an upper end surface of an main element body).

FIG. 9A is a side view thereof, and FIG. 9B is a partially enlarged view of a roughened surface portion in FIG. 9A (the roughened surface portion is configured with a plurality of grooves formed linearly in parallel to each other on an outer periphery surface of an element main body).

FIG. 10A is a plan view thereof, and FIG. 10B is a partially enlarged view of a roughened surface portion in FIG. 10A (the roughened surface portion is constituted with a plurality of concentric grooves formed on an upper end surface of an element main body).

FIG. 11A is a plan view thereof, and FIG. 11B is a partially enlarged view of a roughened surface portion in FIG. 11A (the roughened surface portion is constituted with a first plurality of grooves formed linearly on an upper end surface of an element main body in parallel to each other in an one direction, and a second plurality of grooves formed linearly to each other in an other direction intersecting to the one direction).

DESCRIPTION OF EMBODIMENTS

Hereinafter, the embodiments of the pressure detection unit of the present invention will be described with reference to FIGS. 1 to 19. Note that in FIGS. 1 to 11 referred to in the description of the first embodiment and the second embodiment, and in FIGS. 12 to 19 referred to in the description of the third embodiment and the fourth embodiment, in each of the figure groups, the reference numbers are independently used for indicating each of the components. That is, in the figure groups of FIGS. 1 to 11 and FIGS. 12 to 19, it is likely that different features may be indicated by the same reference number.

First Embodiment

Hereinafter, the pressure sensor of the first embodiment of the present invention will be described with reference to FIGS. 1 to 7.

Figure 1:
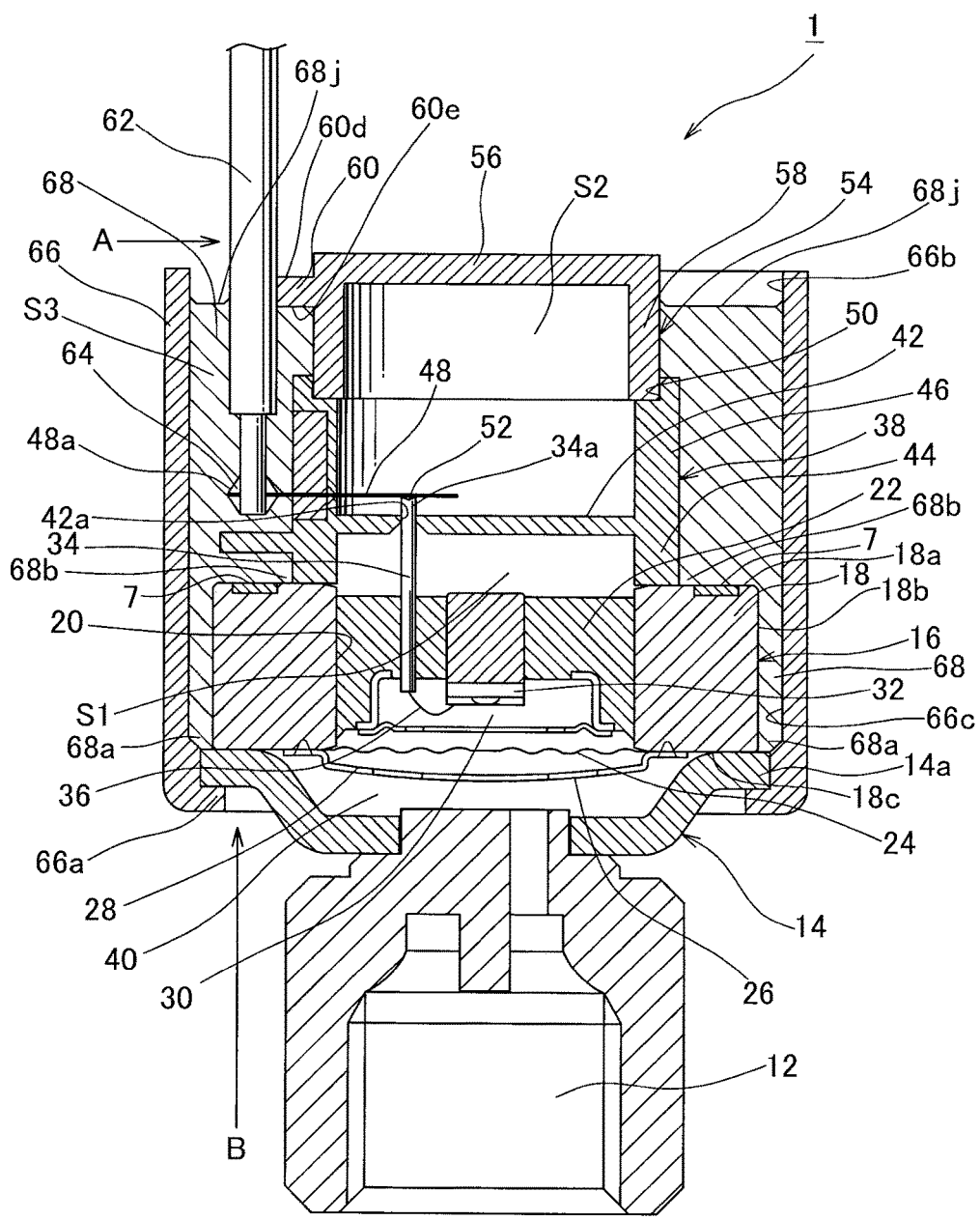
FIG. 1 is a longitudinal sectional view of a pressure sensor of a first embodiment of the present invention.

FIG. 1 is a longitudinal sectional view of the pressure sensor of the first embodiment of the present invention.

Figure 2:
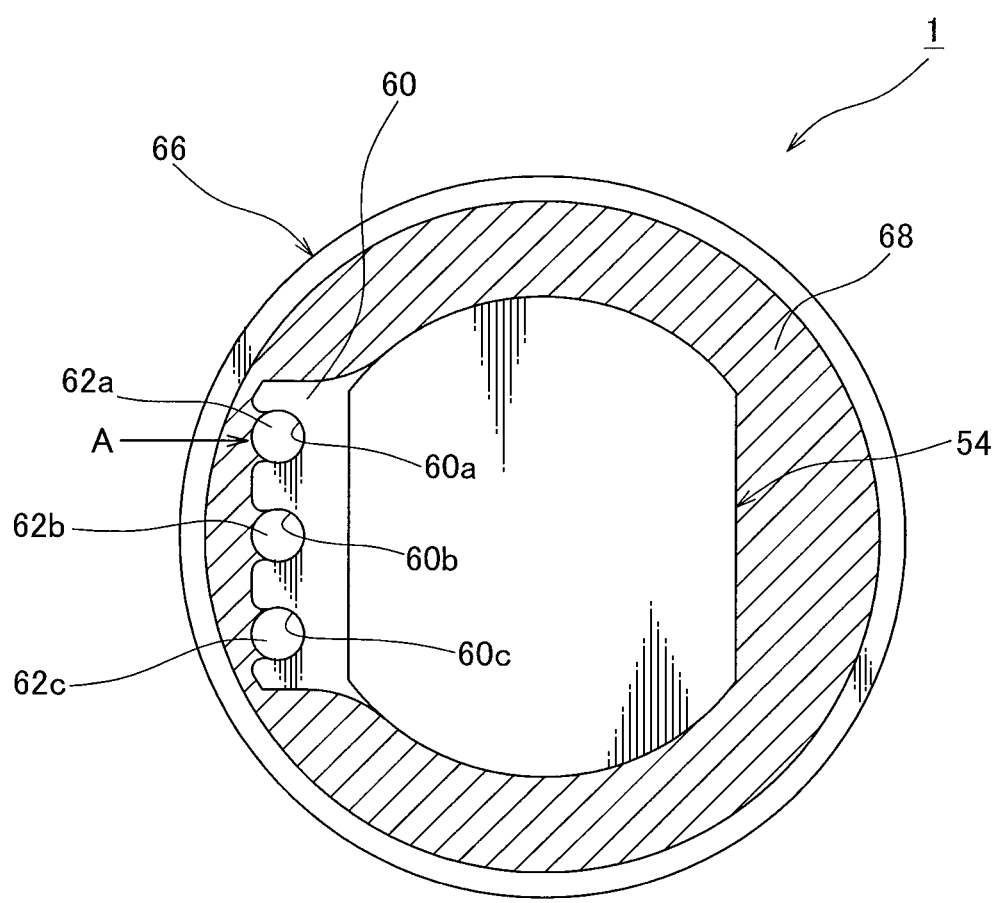
FIG. 2 is a plan view of the pressure sensor in FIG. 1.
Figure 3A:
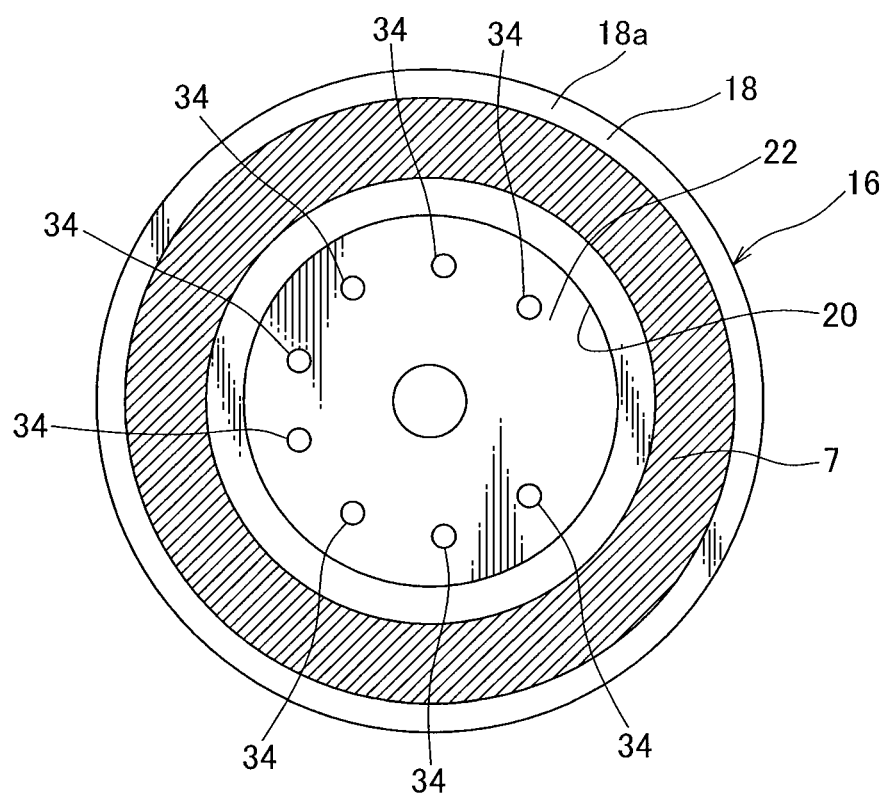
FIGS. 3A and 3B are diagrams showing a structure of a pressure detection element provided in a pressure sensor in FIG. 1.
Figure 3B:
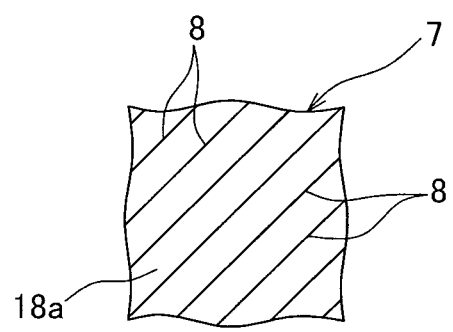
Figure 4:
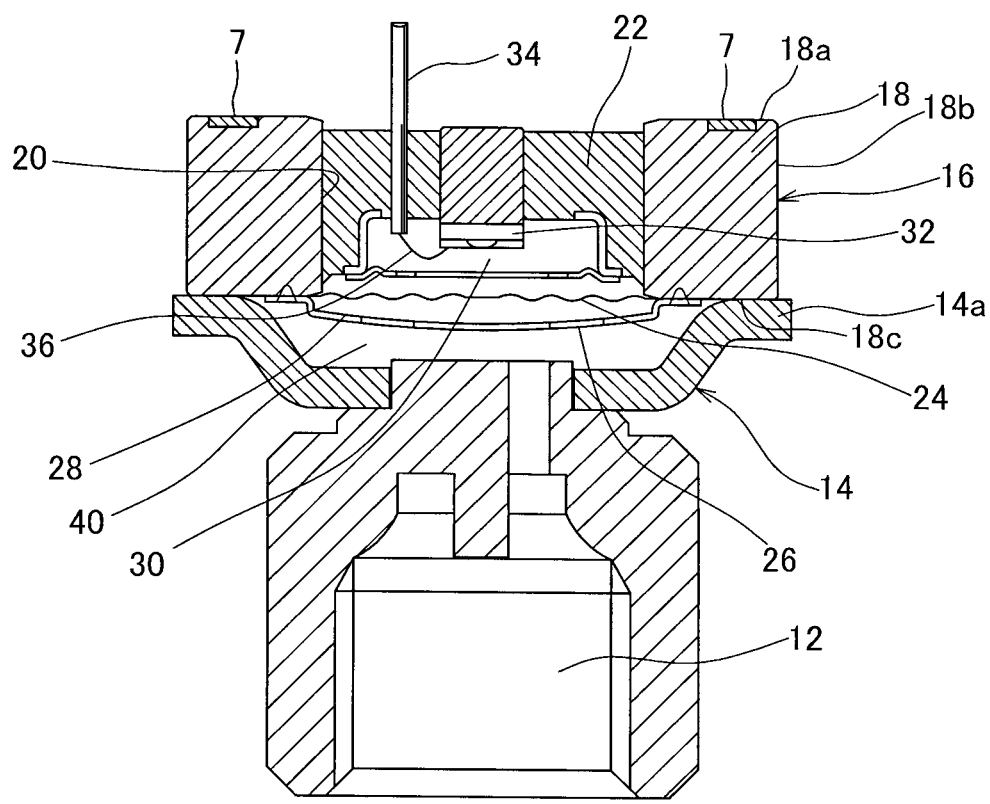
FIG. 4 is a schematic longitudinal sectional view for explaining a manufacturing process (a welding process of a joint member) of the pressure sensor in FIG. 1.
Figure 5:
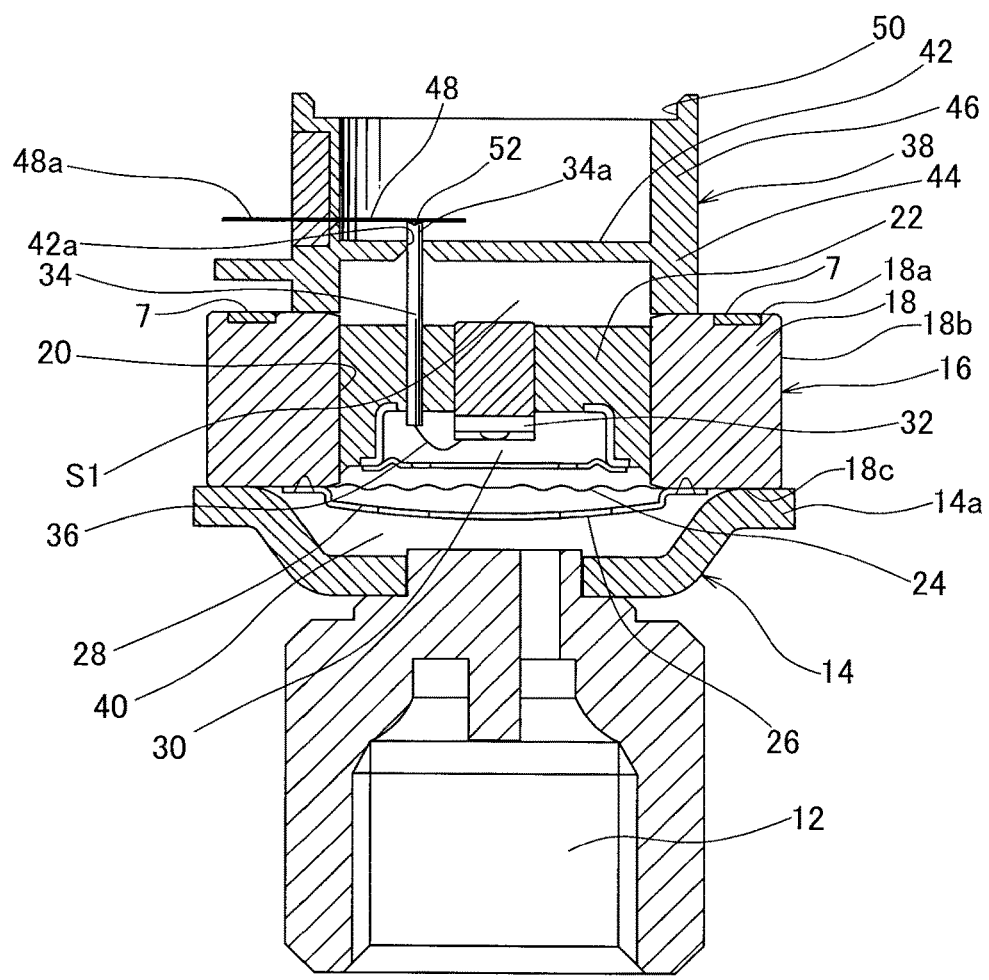
FIG. 5 is a schematic longitudinal sectional view for explaining a manufacturing process (a mounting process of a terminal block) of the pressure sensor in FIG. 1.
Figure 6:
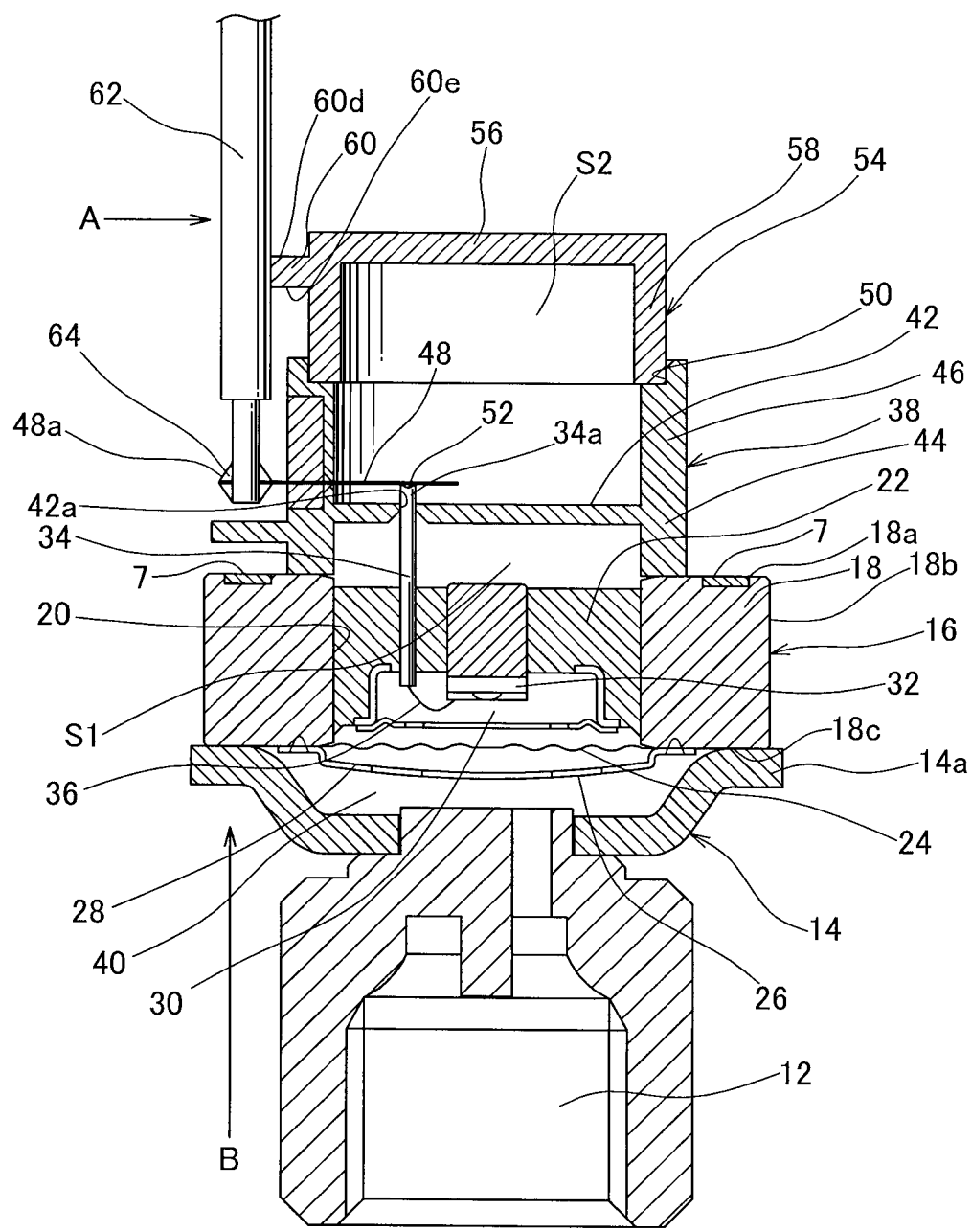
FIG. 6 is a schematic longitudinal sectional view for explaining a manufacturing process (a mounting process of a cover member and an external lead wire) of the pressure sensor in FIG. 1.
Figure 7:
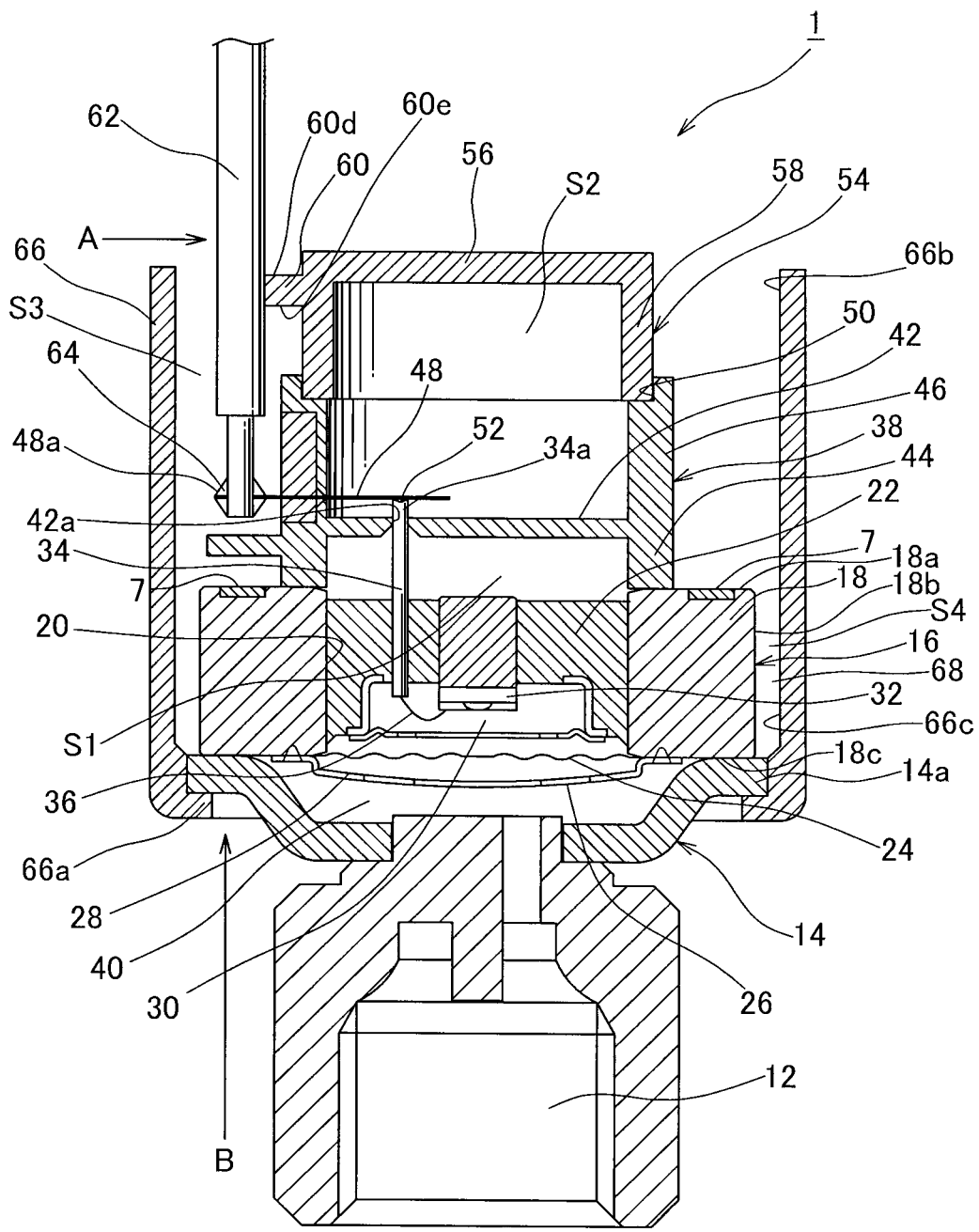
FIG. 7 is a schematic longitudinal sectional view for explaining a manufacturing process (a mounting process of a cover member) of the pressure sensor in FIG. 1.

FIG. 2 is a plan view of the pressure sensor in FIG. 1. FIGS. 3A and 3B are diagrams showing the structure of the pressure detection element provided in the pressure sensor in FIG. 1, FIG. 3A is a plan view, and FIG. 3B is a partially enlarged view of the roughened surface portion in FIG. 3A (the roughened surface portion is configured with the plurality of grooves formed linearly in parallel to each other on the upper end surface of the main element body). FIG. 4 is a schematic longitudinal sectional view for explaining the manufacturing process (the welding process of the joint member) of the pressure sensor in FIG. 1. FIG. 5 is a schematic longitudinal sectional view for explaining the manufacturing process (the mounting process of the terminal block) of the pressure sensor in FIG. 1. FIG. 6 is a schematic longitudinal sectional view for explaining the manufacturing process (the mounting process of the cover member and the external lead wire) of the pressure sensor in FIG. 1. FIG. 7 is a schematic longitudinal sectional view for explaining the manufacturing process (the mounting process of the cover member) of the pressure sensor in FIG. 1. Note that a linguistic concept of "upper and lower" in the following description corresponds to vertical locations in FIG. 1 that shows a relative positional relationship of each member, but not shows an absolute positional relationship thereof.

As illustrated in FIG. 1, a pressure sensor 1 of the first embodiment is a liquid-seal type pressure sensor. The pressure sensor 1 is configured with a joint member 14 in which a flow channel 12 is formed and a pressure detection element 16 for detecting a fluid pressure of the fluid in a flow channel 12. The pressure sensor 1 is provided with a pressure detection element 16 so as to face the flow channel 12 of the joint member 14, and is welded with and adhered to the joint member 14 at its peripheral portion.

The pressure detection element 16 is configured with, for example, an element main body 18 made of a metal such as stainless steel, aluminum, nickel or the like. In the element main body 18, a central opening 20 that penetrates a center portion thereof is formed. In the central opening 20, a hermetic glass 22 is fitted to be affixed thereto, and the central opening 20 is sealed by the hermetic glass 22. The element main body 18 is equivalent to an example of the case, the hermetic glass 22 is equivalent to an example of the insulating member, the central opening 20 is equivalent to an example of the through hole.

Also, as illustrated in FIG. 1, the element main body 18 of the pressure detection element 16, a diaphragm 24 made of metal, and a diaphragm protection cover 28 in which a communication hole 26 is formed, are integrally adhered at their outer peripheral edges by welding.

Then, due to this structure, a fluid-sealing chamber 30 in which oil is enclosed, is formed between the hermetic glass 22 and the diaphragm 24, at a region of the central opening 20 of the element main body 18.

On the other hand, as illustrated in FIG. 1, a sensor chip 32 having a one-chip structure is affixed to a side surface portion of the fluid-sealing chamber 30 of the hermetic glass 22 by an adhesive. That is, the sensor chip 32 is provided in an inside of the element main body 18.

The sensor chip 32 is disposed in the fluid-sealing chamber 30, and is configured as a pressure sensor chip in which a pressure element for detecting a pressure and an integrated electronic circuit that processes an output signal from the pressure element are integrally formed. The sensor chip 32 is equivalent to an example of a pressure detection device.

Also, a plurality of lead pins 34 for inputting and outputting signals with respect to the sensor chip 32 is respectively affixed to the hermetic glass 22 in a penetration state by hermetic process. That is, the plurality of lead pins 34 is arranged in an inside of the central opening 20 penetrating the hermetic glass 22. In this embodiment, eight lead pins 34 in total are provided. That is, for input/output terminals, three pieces of the plurality of lead pins 34 designed for external lead wires 62a (Vcc), 62b (Vout), and 62c (GND) and five pieces of the plurality of lead pins 34 for terminals for adjusting the sensor chip 32, which will be described later, are provided.

The plurality of lead pins 34 are conductively connected (wire-bonded) to the sensor chip 32, for example, via a gold or an aluminum wire 36, and constitute external output terminals and/or external input terminals of the sensor chip 32.

Then, a fluid pressure transmitted from a flow channel 12 of the joint member 14 into a pressure chamber 40 is adapted to press a surface of the diaphragm 24 through the communication hole 26 of the diaphragm protection cover 28 such that a power of the pressure is detected by the sensor chip 32 in the fluid-sealing chamber 30.

In the pressure detection element 16, as illustrated in FIGS. 3A and 3B, an upper end surface 18a thereof (a surface facing upward in the element main body 18 in the figure) an annular roughened surface portion 7 is provided so as to surround the central opening 20. This roughened surface portion 7 will be described later.

Further, as illustrated in FIG. 1, in an upper portion of the pressure detection element 16, a terminal block 38 constituting a first space-forming member out of space-forming members is disposed adjacent to an upside of the element main body 18 of the pressure detection element 16, and is affixed to an upper end surface 18a of the element main body 18 of the pressure detection element 16, for example, by an adhesive.

A terminal block 38 is formed in a substantially cylindrical shape as illustrated in FIG. 1, and there is formed at its substantially central portion, a terminal fixing wall 42 through which insertion holes 42a for inserting the plurality of lead pins 34 is formed. Then, there are formed a lower side wall 44 which extends downward from the terminal fixing wall 42, and an upper side wall 46 which extends upward from the terminal fixing wall 42.

Thus, as illustrated in FIG. 1, there is formed a first space S1 surrounded by the terminal fixing wall 42 and the lower side wall 44 between the pressure detection element 16 and the terminal block 38.

Then, distal ends 34a of the lead pins 34 of the pressure detection element 16 are inserted into insertion holes 42a to be electrically connected to terminals 48 provided so as to penetrate the upper side wall 46 of the terminal block 38 at a connection portion 52, for example, by welding.

In this embodiment, although not illustrated, as shown in FIG. 2 which will be described later, there are provided three pieces of the terminals 48 designed for external lead wires 62a (Vcc), 62b (Vout), and 62c (GND).

Furthermore, as illustrated in FIGS. 1 and 2, in a upper side wall 46 of a terminal block 38, a fitting-stepped portion 50 is formed, and a lid member 54 that constitutes a second space forming member is disposed adjacent to the terminal block 38 so as to fit into the fitting-stepped portion 50.

That is, the lid member 54 is formed in a substantial cup-shape comprised of an upper plate portion 56 and a side wall 58, and the side wall 58 is configured so as to fit into the fitting-stepped portion 50 formed in the upper side wall 46 of the terminal block 38.

Thus, as illustrated in FIG. 1, there are formed a second space S2 surrounded by the terminal fixing wall 42 and the upper side wall 46 of the terminal block 38, and the upper plate portion 56 of the lid member 54 and the side wall 58 between the lid member 54 and the terminal block 38.

That is, due to such configuration, as illustrated in FIG. 1, there are formed a large space configured with the aforementioned spaces S1, S2, which covers the pressure detection element 16, by the lid member 54 disposed adjacent to the terminal block 38 and the terminal block 38. That is, in the terminal fixing wall 42 of the terminal block 38, the above-described spaces S1, S2 are communicated with each other, whereby the terminal block 38 and the lid member 54 eventually form the large space that covers the pressure detection element 16.

Furthermore, as illustrated in FIGS. 1 and 2, there are formed in the side wall 58 of the lid member 54, a lead wire engaging portion 60 protruding outward therefrom. The lead wire engaging portion 60 is formed, as illustrated in FIG. 2, in a substantial rectangular shape, and locking notch holes 60*a*, 60*b*, and 60*c* of the lead wire engaging portion 60 are respectively formed corresponding to three pieces of the external lead wire 62, that is, the external lead wires 62*a* (Vcc), 62*b* (Vout), and 62*c* (GND).

That is, the external lead wires 62*a* (Vcc), 62*b* (Vout), and 62*c* (GND) are adapted to be fitted into and affixed to, as indicated by arrow A in FIGS. 1 and 2, locking notch holes 60*a*, 60*b*, and 60*c*.

On the other hand, as illustrated in FIG. 1, there is electrically connected to an outer end portion 48*a* of the terminals 48 provided so as to penetrate the upper side wall 46 of the terminal block 38, an external lead wire 62 at a connection portion 64, for example, by soldering, welding or the like.

Also, as indicated by arrow B in FIG. 1, there is inserted from the joint member 14 side, an opening 66*b* side of a cover member 66, and a proximal end portion 66*a* in a flange shape projecting to an inside of the cover member 66 is held in a state of abutting to a flange portion 14*a* of the joint member 14.

Thus, as illustrated in FIG. 1, a gap S3 is formed inside of the cover member 66 and there is formed in the gap S3, a sealing-resin portion 68 by being filled with a sealing resin constituting an adhesive from the opening 66*b* side of the cover member 66.

The sealing-resin portion 68, by being filled into the gap S3, is joined to a portion of an outside side surface of the element main body 18 of the pressure detection element 16 in the lower section in the figure of the gap S3 (in this embodiment, specifically the upper end surface 18*a* and the outer peripheral surface 18*b*). Herein, the sealing-resin portion 68 is disposed in a manner surrounding a central opening 20 of the element main body 18 (and a plurality of lead pins 34 arranged in the central opening 20). Further, an outer peripheral edge 68*a* located on the outside side surface of the element main body 18 in the sealing-resin portion 68 is positioned downward in the figure on the outer peripheral surface 18*b* of the element main body 18, and an inner peripheral edge 68*b* is positioned at a vicinity of a fixed point with respect to the terminal block 38 on the upper end surface 18*a* of the element main body 18.

Incidentally, in this case, as illustrated in FIG. 1, an upper end 68*j* of the sealing-resin portion 68 is preferably positioned at a height equal to or lower than a height of an upper surface 60*d* of the lead wire engaging portion 60 of the lid member 54, and is more preferably positioned at a height between the upper surface 60*d* and a lower surface 60*e* of the lead wire engaging portion 60.

Here, a roughened surface portion 7 provided on the upper end surface 18*a* of the element main body 18 of the pressure detection element 16 is described.

The roughened surface portion 7 is formed into, as illustrated in FIGS. 3A and 3B, an annular shape in a plan view, and is disposed in manner surrounding the central opening 20 at a region where the sealing-resin portion 68 is joined on the upper end surface 18*a* of the element main body 18. That is, the roughened surface portion 7 is annularly disposed such that the roughened surface portion 7 partitions between the outer peripheral edge 68*a* and the inner peripheral edge 68*b* located at a region where the sealing-resin portion 68 is joined on the outside side surface (a surface portion facing an outside of the element main body 18, specifically, the upper end surface 18*a*, the outer peripheral surface 18*b* and the lower end surface 18*c*) of the element main body 18. Thus, the moisture having proceeded across the inner peripheral edge 68*b* from the outer peripheral edge 68*a* must pass through the roughened surface portion 7 in order to reach the plurality of lead pins 34 in the central opening 20 of the element main body 18, at the boundary face between the outside side surface of the element main body 18 and the sealing-resin portion 68.

The roughened surface portion 7 is formed by roughening the upper end surface 18*a* of the element main body 18 with a laser irradiation. Thus, the sealing-resin portion 68 enters into the recessed portion of the roughened surface portion 7 enhancing the adherence property between the upper end surface 18*a* and the sealing-resin portion 68, thereby improving a waterproof property of the boundary face with respect to the sealing-resin portion 68.

In this embodiment, the roughened surface portion 7 is configured with, as illustrated in FIG. 3B, a plurality of grooves 8 formed linearly in parallel to each other. The plurality of grooves 8 is formed by scanning laser beam in plural times while shifting a laser irradiation position in a predetermined direction by a groove pitch. The depth of the plurality of grooves 8 ranges from 100 nm to 100 μm, preferably ranges from 0.5 μm to 3 μm, more preferably ranges between 1 μm±0.5 μm.

Next, operations of the pressure sensor 1 as described above are described.

When the pressure sensor 1 is exposed to a liquid such as water or the like for a long period of time, moisture enters from between the joint member 14 and the cover member 66. Then, the moisture penetrates into the boundary face between the outside side surface of the element main body 18 and the sealing-resin portion 68 from a region of the outer peripheral edge 68*a* located on the outside side surface of the element main body 18 in the sealing-resin portion 68. However, the moisture having entered into the boundary face is prevented from progressing by the roughened surface portion 7, thereby the moisture can be prevented from reaching to the plurality of lead pins 34 surrounded by the roughened surface portion 7.

The pressure sensor 1 in the present embodiment thus configured is manufactured by the steps shown in FIGS. 4-7.

That is, as illustrated in FIG. 4, a pressure detection element 16 being pre-assembled integrally is prepared. At this time, in the pressure detection element 16, the roughened surface portion 7 is previously formed on the upper end surface 18a thereof. Then, the joint member 14 is welded to the pressure detection element 16.

Next, as illustrated in FIG. 5, the lower side wall 44 of the terminal block 38 is placed in the upper portion of the element main body 18 of the pressure detection element 16 and is fixed thereto, for example, by an adhesive. In this state, distal ends 34a of the plurality of lead pins 34 of the pressure detection element 16 are in a state of being inserted into the insertion holes 42a of the terminal fixing wall 42 of the terminal block 38.

In this state, distal ends 34a of the lead pins 34 of the pressure detection element 16 are inserted into the insertion holes 42a, and the distal ends 34a of the lead pins 34 are electrically connected to, at the connection portion 52, the terminals 48 provided so as to penetrate the upper side wall 46 of the terminal block 38, for example, by welding.

Incidentally, in this state, as illustrated in FIG. 5, there is formed the first space S1 surrounded by the terminal fixing wall 42 and the lower side wall 44 between the pressure detection element 16 and the terminal block 38.

Then, as illustrated in FIG. 5, the external lead wire 62 is electrically connected to, at the connection portion 64, the outer end portion 48a of the terminals 48 provided so as to penetrate the upper side wall 46 of the terminal block 38, for example, by such as welding, soldering, or the like.

Also, the lid member 54 is disposed adjacent to the terminal block 38 so as to fit into the fitting-stepped portion 50 formed in the upper side wall 46 of the terminal block 38.

As a result, as illustrated in FIG. 6, the second space S2 surrounded by the terminal fixing wall 42 and the upper side wall 46 of the terminal block 38, and the upper plate portion 56 and the side wall 58 of the lid member 54 is brought to a state of being formed between the lid member 54 and the terminal block 38.

Also, as indicated by arrows A in FIGS. 2 and 6, the external lead wires 62a (Vcc), 62b (Vout), and 62c (GND) are respectively fitted into and affixed to locking notch holes 60a, 60b, and 60c of the lead wire engaging portion 60.

In this state, as illustrated in FIG. 7, the proximal end portion 66a in a flange shape projecting to an inside of the cover member 66 is brought to a state of abutting to the flange portion 14a of the flange member 14 by inserting the opening 66b side of the cover member 66 from the joint member 14 side. Further, if necessary, the flange portion 14a of the joint member 14 and the proximal end portion 66a of the cover member 66 are fixed to each other, for example, by welding or the like.

Finally, as illustrated in FIG. 1, a sealing resin constituting an adhesive is filled up into the gap S3 formed in the inside of the cover member 66 from the opening 66b of the cover member 66 side, to form the sealing-resin portion 68. Through these steps, the pressure sensor 1 is made up.

As described above, the pressure sensor 1 of this embodiment includes: (a) the pressure detection element 16 comprised of the element main body 18 made of stainless steel, aluminum or nickel, the hermetic glass 22 filled up in the central opening 20 provided in the element main body 18, the sensor chip 32 provided in the inside of the element main body 18, and the plurality of lead pins 34 electrically connected to the terminals of the sensor chip 32 and provided in the inside of the central opening 20 in a manner penetrating the hermetic glass 22; and (b) the sealing-resin portion 68 joined to the outside side surface of the element main body 18 in a manner surrounding the plurality of lead pins 34. Then, in the pressure sensor 1, there is provided by using a laser irradiation, the roughened surface portion 7 formed in an annular shape so as to be disposed at a region where the sealing-resin portion 68 on the upper end surface 18a of the element main body 18 is joined, in a manner partitioning the outer peripheral edge 68a and the inner peripheral edge 68b located on the outside side surface of the element main body 18 in the sealing-resin portion 68.

Also, in the pressure sensor 1, the roughened surface portion 7 is configured with the plurality of grooves 8 formed by performing laser scanning in plural times.

Further, in the pressure sensor 1, the grooves 8 are respectively formed linearly in parallel to each other.

As described above, according to this embodiment, the sealing-resin portion 68 is joined to the outside side surface of the element main body 18 made of stainless steel, aluminum or nickel in a manner surrounding the plurality of lead pins 34, and there is formed by a laser irradiation at a region where the sealing-resin portion 68 is joined in the upper end surface 18a as a portion of the outside side surface of the element main body 18, the annular roughened surface portion 7 partitioning the outer peripheral edge 68a and the inner peripheral edge 68b located on the outside side surface of the element main body 18. Thus, the moisture having entered into the boundary face between the element main body 18 and the sealing-resin portion 68 from the outer peripheral edge 68a located on the outside side surface of the element main body 18 in the sealing-resin portion 68 must pass through the roughened surface portion 7 in order to reach the plurality of lead pins 34. Then, in the roughened surface portion 7, an adhesive enters into in concave portions caused by the roughening of a laser irradiation enhancing the adherence property between the element main body 18 and the sealing-resin portion 68, thereby a waterproof property of the boundary face between the roughened surface portion 7 of the element main body 18 and the sealing-resin portion 68 is improved. Thus, in the roughened surface portion 7, the moisture is prevented from passing therethrough and the moisture is restricted from reaching the plurality of lead pins 34, thereby a waterproof property thereof is improved. Further, since the roughened surface portion 7 is formed by a laser irradiation, for example, as compared to the case in which the roughened surface portion is formed by such as plasma cleaning or UV irradiation, the roughened surface portion can be easily formed to a desired shape. Thus, the roughened surface portion in an annular shape can be easily provided.

Further, the roughened surface portion 7 is configured with the plurality of grooves 8 formed by performing laser scanning in plural times. Thus, the roughened surface portion 7 can be more easily formed with simple laser control.

Further, the plurality of grooves 8 in the roughened surface portion 7 is formed linearly in parallel to each other. Thus, the roughened surface portion can be more easily formed with very simple laser control.

Second Embodiment

Hereinafter, the pressure sensor of the second embodiment of the present invention will be described with reference to FIGS. 8 and 9.

Figure 8:
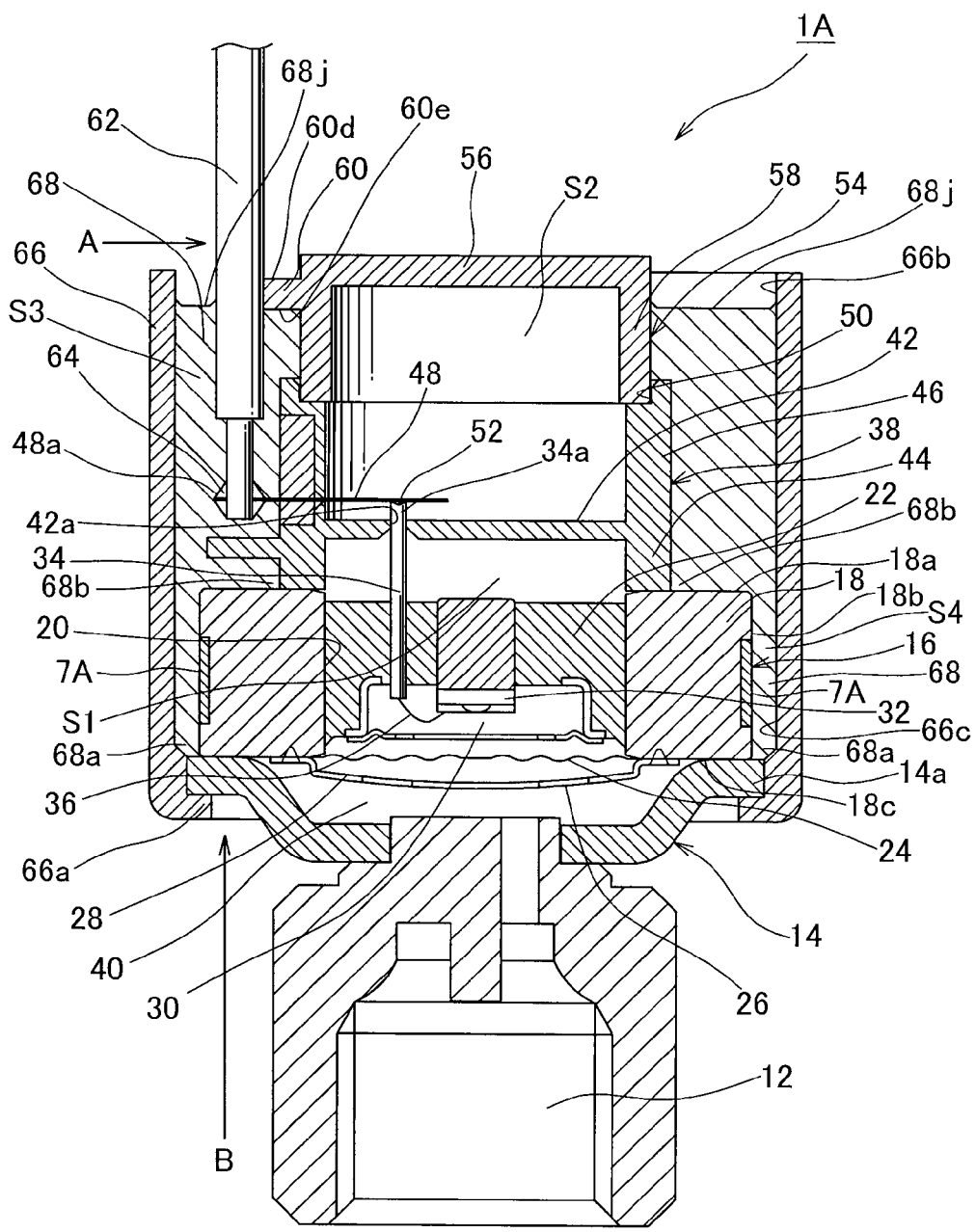
FIG. 8 is a longitudinal sectional view of a pressure sensor of a second embodiment of the present invention.
Figure 9A:
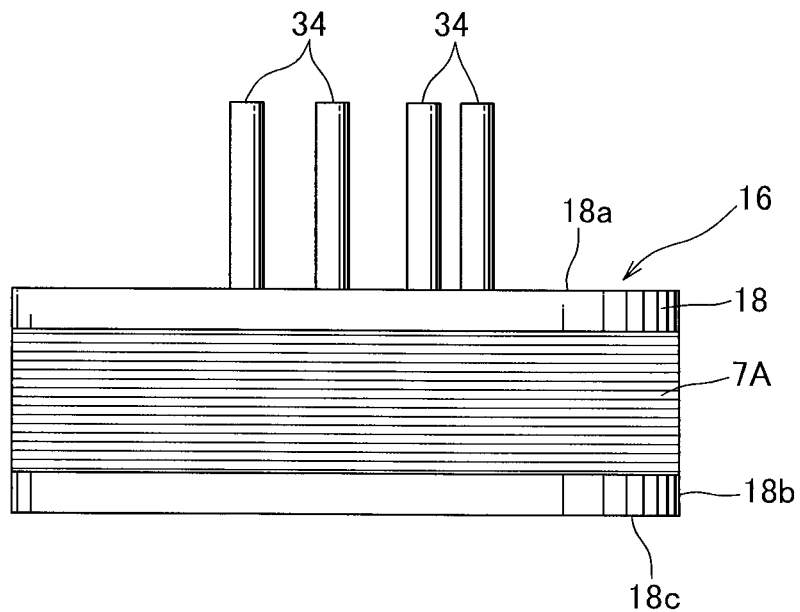
FIGS. 9A and 9B are diagrams showing a structure of a pressure detection element provided in a pressure sensor in FIG. 8.
Figure 9B:
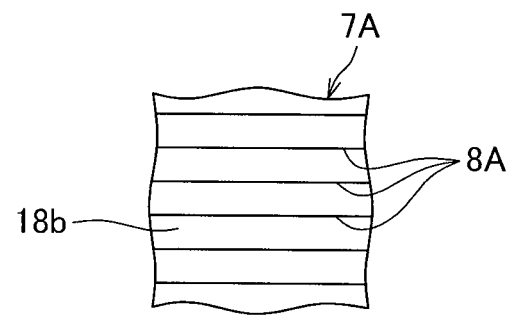

FIG. 8 is a longitudinal sectional view of the pressure sensor of the second embodiment of the present invention. FIGS. 9A and 9B are diagrams showing a structure of the pressure detection element provided in the pressure sensor in FIG. 8, FIG. 9A is a side view thereof, and FIG. 9B is a partially enlarged view of the roughened surface portion in FIG. 9A (the roughened surface portion is configured with the plurality of grooves formed linearly in parallel to each other on the outer periphery surface of the element main body). Note that a linguistic concept of "upper and lower" in the following description corresponds to vertical locations in FIG. 8 that shows a relative positional relationship of each member, but not shows an absolute positional relationship thereof.

The pressure sensor shown in FIG. 8 (indicated by the reference number 1A in the figure) is comprised of a roughened surface portion 7A provided on the outer peripheral surface 18*b* of the element main body 18 of the pressure detection element 16 is provided in place of the roughened surface portion 7 provided on the upper end surface 18*a* of the element main body 18 of the pressure detection element 16 in the pressure sensor 1 of the first embodiment as described above. The rest of the configuration is the same as the first embodiment. Thus, in the following description, descriptions of the same portions as the pressure sensor 1 of the first embodiment will be omitted by indicating the same reference numbers.

The roughened surface portion 7A is formed, as shown in FIGS. 9A and 9B, in an annular shape along a circumferential direction in the outer peripheral surface 18*b* of the element main body 18 in the pressure detection element 16. That is, the roughened surface portion 7A is annularly disposed at a region where the sealing-resin portion section 68 is joined on the outside side surface of the element main body 18 (a surface portion facing the outside of the element main body 18, specifically, the upper end surface 18*a*, the outer peripheral surface 18*b* and the lower end surface 18*c*) so as to partition between the outer peripheral edge 68*a* and the inner peripheral edge 68*b* located on the outside side surface of the sealing-resin portion 68. Thus, the moisture proceeding across the inner peripheral edge 68*b* from the outer peripheral edge 68*a* at the boundary face between the outside side surface of the element main body 18 and the sealing-resin portion 68, must pass though the roughened surface portion 7A in order to reach the plurality of lead pins 34.

The roughened surface portion 7A is formed by surface roughening the outer peripheral surface 18*b* of the element main body 18 by a laser irradiation. Thus, the sealing-resin portion 68 enters into the recessed portions of the roughened surface portion 7A, enhancing the adherence property between the outer peripheral surface 18*b* and the sealing-resin portion 68, thereby improving a water-resistance property at the boundary face with respect to the sealing-resin portion 68.

In this embodiment, the roughened surface portion 7A is configured with, as illustrated in FIG. 9B, the plurality of grooves 8A formed linearly (annually) in parallel to each other in a circumferential direction of the outer peripheral surface 18*b* of the element main body 18. The plurality of grooves 8A is formed by performing laser scanning in plural times in a direction intersecting a circumferential direction while shifting the laser irradiation position by a groove pitch in the circumferential direction. That is, the plurality of grooves 8A is respectively formed in an annular shape, as well as is formed in a concentric shape without intersecting with each other. The depth of the plurality of grooves 8A ranges from 100 nm to 100 μm, preferably ranges from 0.5 μm to 3 μm, and more preferably ranges between 1 μm±0.5 μm.

Operations of the pressure sensor 1A thus configured are the same as those of the pressure sensor 1A of the first embodiment as described above. The moisture having entered into the boundary face between the element main body 18 and the sealing-resin portion 68, upon reaching to the outer peripheral surface 18*b* of the element main body 18, is prevented from progressing by the roughened surface portion 7A. Thus, the moisture does not proceed any further, thereby the moisture can be restrained from reaching up to the plurality of lead pins 34.

As described above, the pressure sensor 1A of this embodiment includes: (a) the pressure detection element 16 comprised of the element main body 18 made of stainless steel, aluminum or nickel, the hermetic glass 22 filled up in the central opening 20 provided in the element main body 18, the sensor chip 32 provided in the inside of the element main body 18, and the plurality of lead pins 34 electrically connected to the terminals of the sensor chip 32 and provided in the inside of the central opening 20 in a manner penetrating the hermetic glass 22; and (b) the sealing-resin portion 68 joined to the outside side surface of the element main body 18 in a manner surrounding the plurality of lead pins 34. Then, in the pressure sensor 1A, there is formed in an annular shape by using a laser irradiation, the roughened surface portions 7 partitioning the outer peripheral edge 68*a* and the inner peripheral edge 68*b* located on the outside side surface of the element main body 18 at a region where the sealing-resin portion 68 is joined on the outer peripheral surface 18*b* of the element main body 18.

Further, in the pressure sensor 1A, the roughened surface portion 7A is configured with the plurality of grooves 8A formed by performing a laser scanning in plural times.

Further, in the pressure sensor 1A, the plurality of grooves 8A is formed linearly in parallel to each other.

Also, in the pressure sensor 1A, the plurality of grooves 8A is respectively formed in an annular shape, as well as is formed in a concentric shape without intersecting with each other.

As described above, according to this embodiment, the sealing-resin portion 68 is joined to the outside side surface of the element main body 18 made of stainless steel, aluminum or nickel in a manner surrounding the plurality of lead pins 34, and the annular roughened surface portion 7A partitioning the outer peripheral edge 68*a* and the inner peripheral edge 68*b* located on the outside side surface of the element main body 18 in the sealing-resin portion 68 is formed by a laser irradiation at a region where the sealing-resin portion 68 is joined on the outer peripheral surface 18*b* as a portion of the outside side surface of the element main body 18. Thus, the moisture having entered into the boundary face between the element main body 18 and the sealing-resin portion 68 from the outer peripheral edge 68*a* located on the outside side surface of the element main body 18 must pass through the roughened surface portion 7A in order to reach the plurality of lead pins 34. Then, in the roughened surface portion 7A, the adhesive enters into concave portions caused by the roughening by a laser irradiation, enhancing the adherence property between the element main body 18 and the sealing-resin portion 68, thereby a waterproof property of the boundary face between the roughened surface portion 7A of the element main body 18 and the sealing-resin portion 68 is improved. Thus, at the roughened surface portion 7A, the moisture is prevented from passing therethrough, and the moisture is restricted from reaching the plurality of lead pins 34, thereby a waterproof property thereof is improved. Further, since the roughened surface portion 7A is formed by a laser irradiation, as compared to the case in which the roughened surface portion is formed, for example, by such as plasma cleaning or UV irradiation, the roughened surface portion can be easily formed to a desired shape. Thus, the annular roughened surface portion can be easily provided.

Further, the roughened surface portion 7A is configured with the plurality of grooves 8A formed by performing laser scanning in plural times. Thus, the roughened surface portion 7A can be more easily formed by using a simple laser control.

Further, the plurality of grooves 8A in the roughened surface portion 7A is formed linearly in parallel to each other. Thus, the roughened surface portion can be more easily formed by using a very simple laser control.

Further, the plurality of grooves 8A in the roughened surface portion 7A is respectively formed in an annular shape, as well as is formed in a concentric shape without intersecting with each other. Thus, the plurality of grooves 8A serves as moats that oppose the moisture having intruded to the boundary face between the element main body 18 and the sealing-resin portion 68 multiple times, to further restrain the moisture from reaching the plurality of lead pins 34, thereby further enabling an enhancement of a waterproof property thereof.

Although the present invention has been described by referencing the first embodiment and the second embodiment as preferred embodiments, the pressure detection unit of the present invention is not limited to the configurations of these embodiments.

Figure 10A:
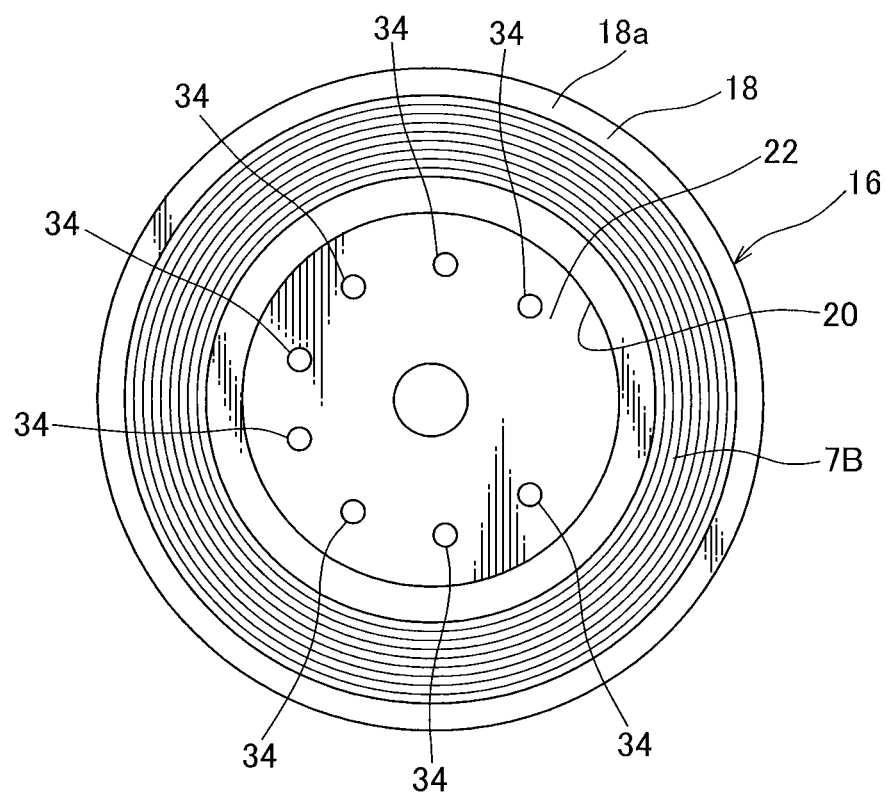
FIGS. 10A and 10B are diagrams showing a structure of a first variation of the pressure detection element provided in a pressure sensor in FIG. 1.
Figure 10B:
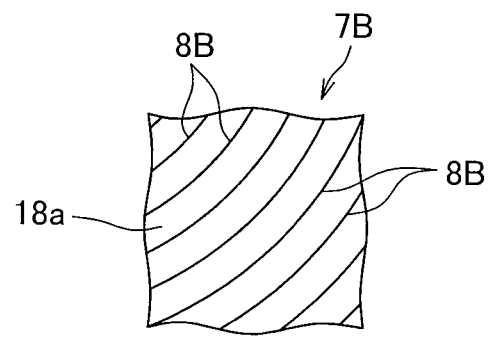

For example, in the first embodiment as described above, although the roughened surface portion 7 is configured with the plurality of grooves 8 formed linearly in parallel to each other, the roughened surface portion 7 is not limited thereto. In place of the roughened surface portion 7 thus configured, as illustrated in FIGS. 10A and 10B, a configuration comprised of the annular roughened surface portion 7B configured with the plurality of grooves 8B is respectively formed in an annular shape, as well as formed in a concentric shape that surrounds the central opening 20 without intersecting with each other, may also be employed. Due to such configuration, the plurality of grooves 8B serves as moats that oppose moisture having intruded to the boundary face between the upper end surface 18a of the element main body 18 and the sealing-resin portion 68 multiple times, to further restrain water from reaching the plurality of lead pins 34, thereby further enabling an enhancement of a waterproof property thereof.

Figure 11A:
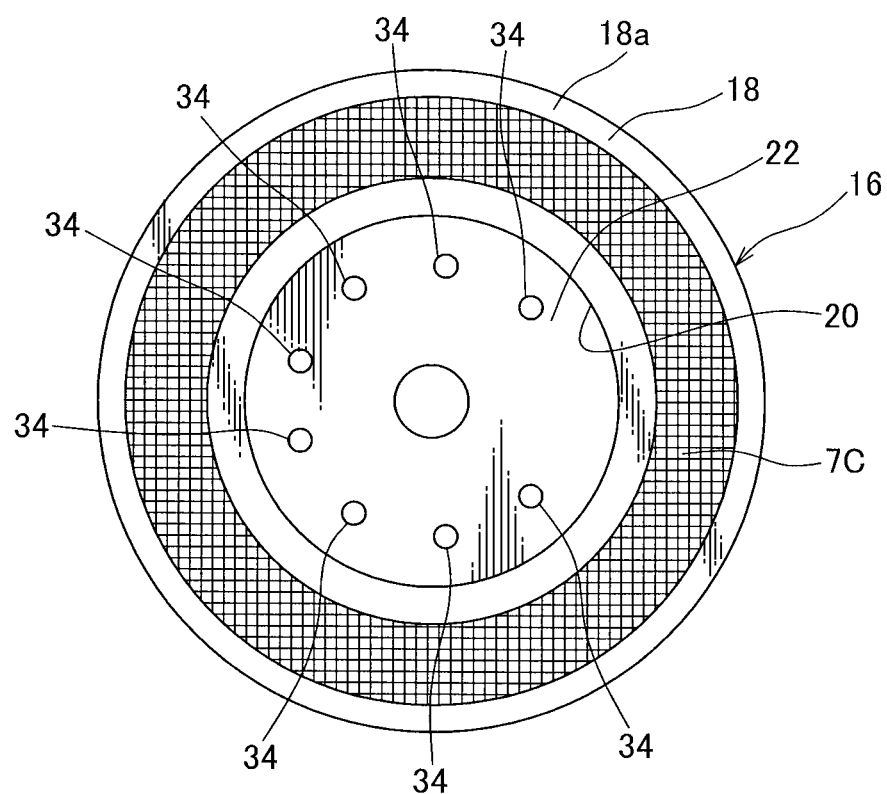
FIGS. 11A and 11B are diagrams showing a configuration of a second variation of a pressure detection element provided in a pressure sensor in FIG. 1.
Figure 11B:
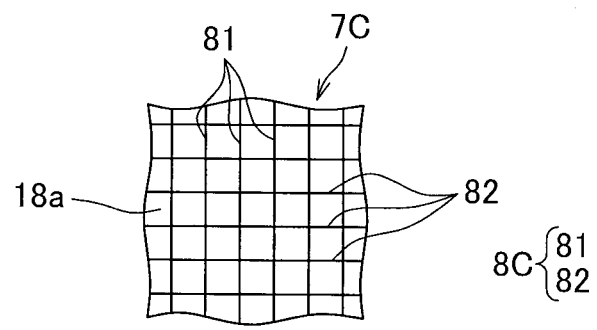

Alternatively, in place of the roughened surface portion 7 thus configured, as illustrated in FIGS. 11A and 11B, a configuration comprised of the roughened surface portion 7C configured with a first plurality of groove portions 81 formed linearly in parallel to each other and a second plurality of groove portions 82 formed linearly in parallel to each other in a direction intersecting the first plurality of groove portions 81, may also be employed. Thereby, the roughened surface portion 7C having an improved waterproof property can be easily formed by using a simple laser control.

Alternatively, in place of the roughened surface portion 7 thus configured, a roughened surface portion configured with a plurality of polka-dot patterned holes arranged apart from each other by using a laser irradiation, may also be employed.

Alternatively, in the second embodiment as described above, in place of the plurality of grooves 8A in the roughened surface portion 7A, a plurality of grooves 8, 8C as illustrated in FIGS. 3B and 11B may also be employed.

In the first embodiment as described above, although the roughened surface portion 7 is formed in a circular ring in a plan view, and in the second embodiment, the roughened surface portion 7A is formed in a cylindrical annular shape, the shape of the roughened surface portions are not limited thereto. For example, in place of the roughened surface portion 7 formed in a circular ring, a roughened surface portion formed in a rectangular ring shape surrounding the central opening 20 in which the plurality of lead pins 34 on the upper end surface 18a of the element main body 18 may also be employed. Alternatively, in a configuration where the entire of the upper end surface 18a and the outer peripheral surface 18b of the element main body 18 is covered by the single sealing-resin portion 68, the roughened surface portion 7 may be formed in an annular shape surrounding the central opening 20 across the upper end surface 18a and the outer peripheral surface 18b. The roughened surface portion may be, unless contrary to objectives of the present invention, formed in a annular shape partitioning between the outer peripheral edge 68a and the inner peripheral edge 68b in the sealing-resin portion 68 of the element main body 18 in order that the roughened surface portions 7, 7A must be passed through when being moved from the outer peripheral edge 68a to the inner peripheral edge 68b (that is, the plurality of lead pins 34) located on the outside side surface of the element main body 18 in the sealing-resin portion 68.

Further, in the first embodiment as described above, although the roughened surface portion 7 is disposed between the outer peripheral edge 68a and inner peripheral edge 68b located on the outside side surface of the element main body 18 in the sealing-resin portion 68, the roughened surface portion 7 is not limited thereto. For example, an outer edge of the roughened surface portion 7 may be located between the outer peripheral edge 68a and the inner peripheral edge 68b, and an inner edge of the roughened surface portion 7 may be located closer to the plurality of lead pins being further inside than the inner peripheral edge 68b. Alternatively, the outer edge of the roughened surface portion 7 may be located at a region of the outside of the outer peripheral edge 68a, and the inner edge of the roughened surface portion 7 may be located closer to the plurality of lead pins being further inside than the inner peripheral edge 68b. Such configuration is also an example of configurations in which the roughened surface portion 7 (specifically, a portion of the roughened surface portion 7) is disposed so as to partition the outer peripheral edge 68a and the inner peripheral edge 68b located on the outside side surfaces of the element main body 18 in the sealing-resin portion 68. That is, unless contrary to the objectives of the present invention, as for the roughened surface portion 7 (a portion or an entire thereof), so far as partitioning the outer peripheral edge 68a and the inner peripheral edge 68b located on the outside side surfaces of the element main body 18 in the sealing-resin portion 68, the configuration thereof is arbitrarily designed.

Third Embodiment

Hereinafter, the pressure detection unit of the third embodiment of the present invention will be described with reference to FIGS. 12 and 13.

Figure 12:
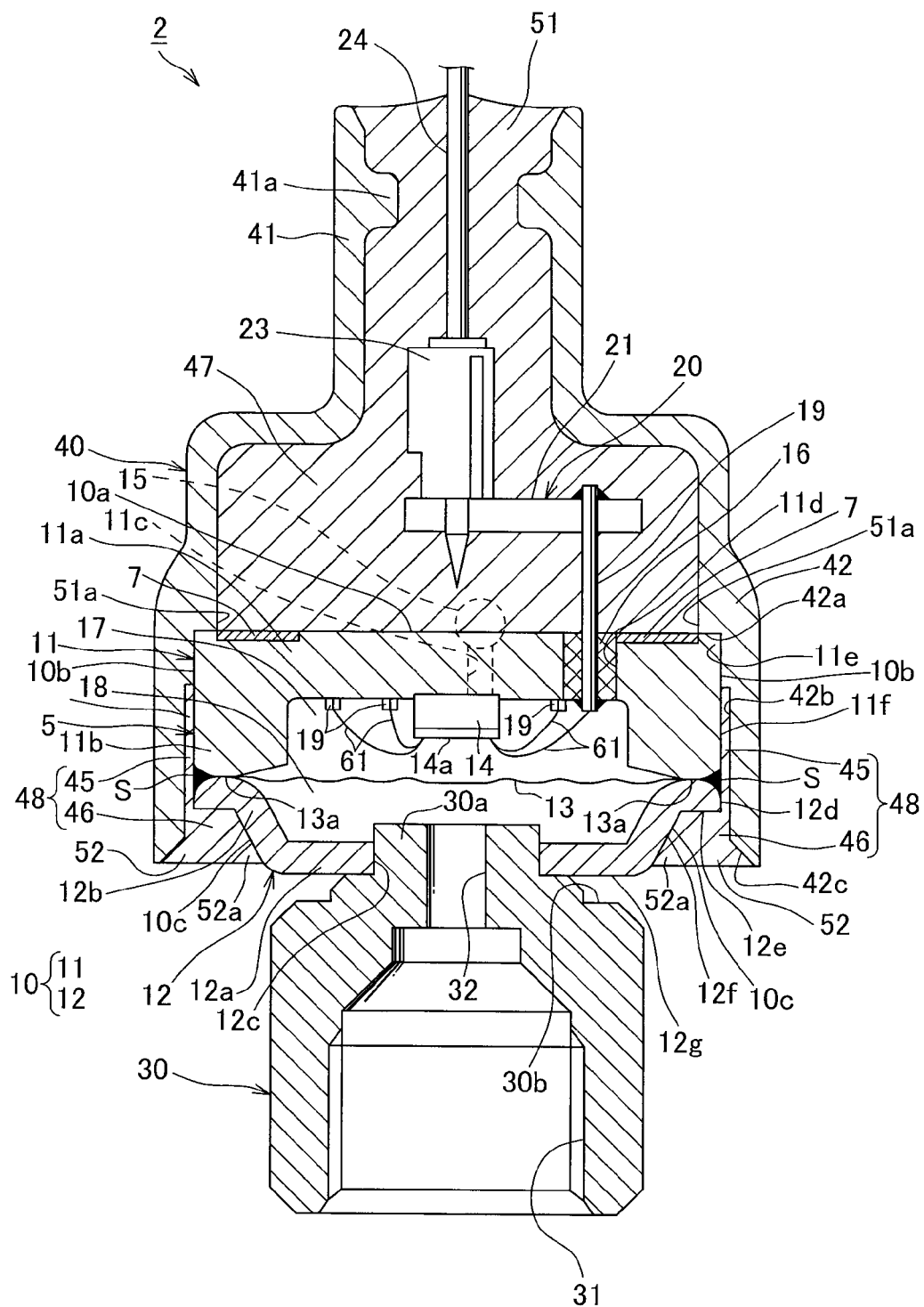
FIG. 12 is a diagram showing a longitudinal sectional view of a pressure detection unit of a third embodiment of the present invention.
Figure 13A:
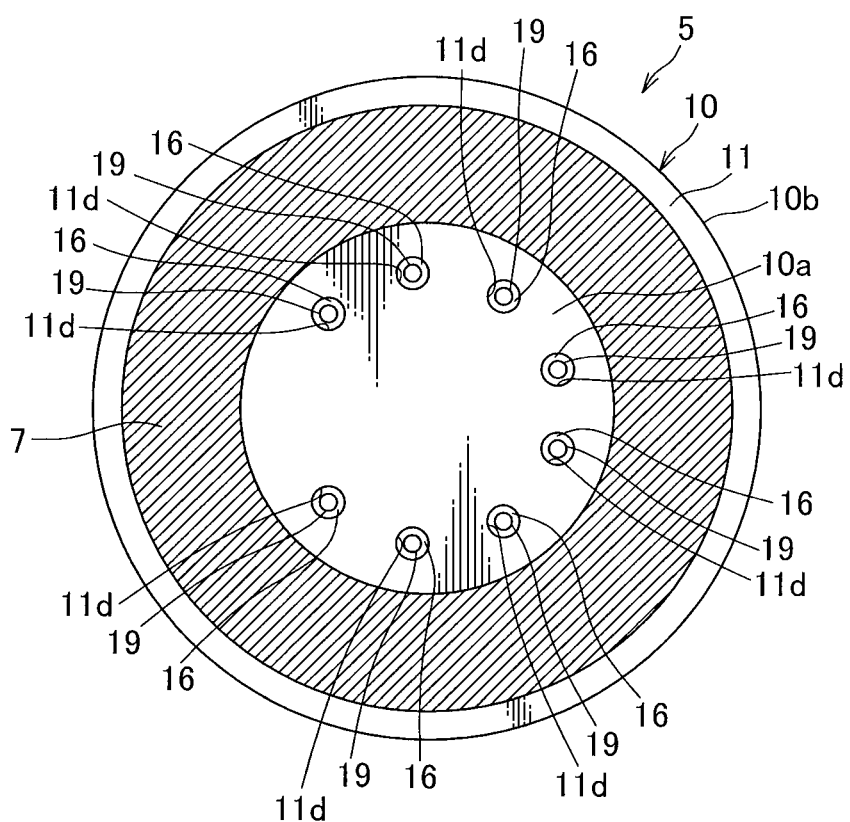
FIG. 13A is a plan view of a pressure detection element provided in a pressure detection unit in FIG. 12.
Figure 13B:
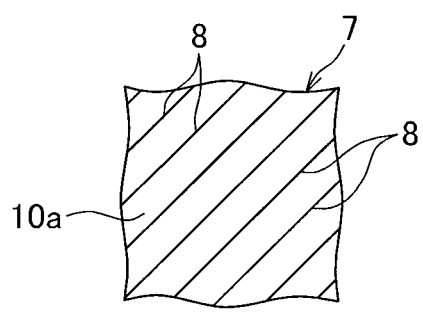
FIG. 13B is a partially enlarged view of a roughened surface portion in FIG. 13A (the roughened surface portion is configured with a plurality of grooves formed linearly in parallel to each other on an upper end surface of a case).

FIG. 12 is a diagram showing a longitudinal sectional view of the pressure detection unit of the third embodiment of the present invention. FIG. 13A is a plan view of the pressure detection element provided in the pressure detection unit in FIG. 12, and FIG. 13B is a partially enlarged view of the roughened surface portion in FIG. 13A (the roughened surface portion is configured with the plurality of grooves formed linearly in parallel to each other on the upper end surface of the case). Note that a linguistic concept of "upper and lower" in the following description corresponds to vertical locations in FIG. 12 that shows a relative positional relationship of each member, but not shows an absolute positional relationship thereof.

The pressure detection unit depicted in FIG. 12 (indicated by the reference number 2 in the figure) is comprised of a pressure detection element 5, an electrical connection portion 20, a joint member 30, a cover 40, a first adhesive 51, and a second adhesive 52.

The pressure detection element 5 is comprised of a case 10 in a substantially cylindrical shape consisted of a base 11 and a receiving member 12, a diaphragm 13, a pressure detection device 14, and a plurality of lead pins 19.

The base 11 is formed in a lid-like shape including a base body 11a formed in a discoid shape and a flange portion 11b erected at a right angle being directed downward in the figure from a peripheral edge of the base body 11a.

In the base body 11a, an oil-filling hole 11c for sealing oil being lead to the pressure receiving space 17 that will be described later, is formed so as to penetrate the base body 11a. The oil-filling hole 11c is shut with a ball 15 after filling up with the oil. Further, in the base body 11a, a plurality of lead-pin-leading-out holes 11d is formed so as to penetrate the base body 11a. For example, a plurality of lead pins 19 formed in a rod-like shape by using conductive material such as copper is inserted into the plurality of lead-pin-leading-out holes 11d and the plurality of lead-pin-leading-out holes 11d is sealed with a hermetic seal 16 as an insulating member so as to prevent an oil leakage. Thus, the plurality of lead pins 19 is affixed to the base 11 with the hermetic seal 16 in a state of being electrically insulated thereto. The plurality of lead-pin-leading-out holes 11d is equivalent to an example of through holes, and the hermetic seal 16 is equivalent to an example of insulating members.

The receiving member 12 is formed in a plate-like shape comprised of a disc-shaped receiving member body 12a and a flange portion 12b erected in an obliquely upward direction in the figure in the periphery of the receiving member body 12a so as to be apart form a center thereof. The distal end of the flange portion 12b is formed flat being substantially in parallel to the receiving member body 12a. In the central portion of the receiving member body 12a, an opening 12c is formed. The base 11 and the receiving member 12 are arranged such that a distal end of the flange portion 11b of the base 11 and a distal end of the flange portion 12b of the receiving member 12 in a manner overlapping with sandwiching the diaphragm 13 that will be described later. A surface facing downward in the figure in the receiving member 12 is a lower end surface 10c of the case 10. The lower end surface 10c is configured such that an annular lower surface 12e, an outer tapered peripheral surface 12f and an annular lower surface 12g continue to each other in concentric shapes.

The diaphragm 13 is formed in an annular membrane shape; the outer peripheral edge portion 13a thereof is disposed so as to be sandwiched by a distal end of the flange portion 11b of the base 11 and the distal end of the flange portion 12b of the receiving member 12.

The distal end of the flange portion 11b of the base 11, the distal end of the flange portion 12b of the receiving member 12, and the outer peripheral edge portion 13a of the diaphragm 13 are welded to each other by a laser welding or the like at a joining portion S thereof and are integrally connected and fixed to each other in a sealed state at the joining portion S. By joining the base 11 and the receiving member 12 together, they constitute the case 10 serving as an outer shape of the pressure detection element 5, and the diaphragm 13 is attached to the case 10 so as to partition a space formed inside of the case 10. Between the base 11 and the diaphragm 13, there is formed a pressure receiving space 17 to be sealed with oil is formed, and between the receiving member 12 and the diaphragm 13, there is formed a pressurized space 18.

The base 11, the receiving member 12 and the diaphragm 13 are preferably configured with stainless steel as a material thereof. Alternatively, a portion or the entire thereof may be configured with, for example, aluminum (including aluminum alloy) or nickel (including a nickel alloy) as a material thereof.

In the pressure detection device 14, the following items are integrated using a technology for integrating semiconductor integrated circuit device: (a) the diaphragm unit (silicon diaphragm) formed by etching a back central portion of a silicon substrate, (b) the bridge circuit including a plurality of detecting element portions (piezoresistive elements) and formed in the diaphragm unit, and an electronic circuit unit configured by an amplifier circuit for processing an output signal from the bridge circuit, a linearity correction circuit, a temperature compensation circuit, a correction data holding circuit or the like. The pressure detection device 14 outputs a pressure signal corresponding to a pressure applied to the pressure receiving portion 14a made of a diaphragm unit.

The pressure detection device 14 is mounted on the base 11 in a state of being disposed in the inside of the pressure receiving space 17. That is, the pressure detection device 14 is provided in the case 10. A metal terminal portion (a bonding pad) of the pressure detection device 14 is connected to one end of the plurality of lead pins 19 with a bonding wire 61 at the inside of the pressure receiving space 17. Thereby, the pressure detection device 14 is electrically connected to a substrate 21 of an electrical connection portion 20 that will be described later via the plurality of lead pins 19 extending through the plurality of lead-pin-leading-out holes 11d formed penetrating the base body 11a of the base 11.

As illustrated in FIGS. 13A and 13B, in the upper end surface 10a of the case 10 (the surface facing an upward direction in the figure in the base body 11a of the base 11), an annular roughened surface portion 7 is provided so as to surround the plurality of lead-pin-leading-out holes 11d. The roughened surface portion 7 will be described later.

The electrical connection portion 20 are disposed in a cover 40 that will be described later, and is comprised of a substrate 21, a connector 23 connected to the substrate 21, and a lead wire 24 connected to the connector 23. The substrate 21 is connected to the other end of the plurality of lead pins 19, that is, via the plurality of lead pins 19, the substrate 21 and the pressure detection device 14 are electrically connected. Thus, the pressure signal output from the pressure detection device 14 is extracted from the lead wire 24 to the outside thereof via the plurality of lead pins 19, the substrate 21 and the connector 23.

The joint member 30 is configured with copper as a material. Alternatively, the joint member 30 may be configured with copper alloy such as brass, the same synthetic resin as a material of the cover 40 that will be described later, or the like. A one end portion of the joint member 30 in an upward location in the figure is formed in a substantially cylindrical shape as well as in a step-like shape whose diameter is reduced stepwise. A distal end 30a of the one end of the joint member 30 is inserted into the opening 12c of the receiving member 12 so that the pressurized space 18 and the fluid-inlet-flow channel 32 arranged inside of the joint member 30 communicate with each other. Further, the distal end 30a of the one end portion of the joint member 30 and a peripheral edge of the opening 12c of the receiving member 12 is brazed in a manner of sealing therebetween so that the joint member 30 is affixedly attached to the receiving member 12.

In an inside of the other end portion of the joint member 30, there is provided a coupling screw portion 31 on which female thread is cut enabling a connection with a fluid inlet pipe not shown by screw. That is, the joint member 30 constitutes a flow tube member, and the receiving member 12 constitutes a fluid-pipe-connection member to which the joint member 30 that is a flow tube member is connected.

When a fluid-inlet pipe is connected to the coupling screw portion 31 of the joint member 30, a fluid pressure is introduced into the pressurized space 18, and is transmitted to the diaphragm 13 through the fluid-inlet-flow channel 32 of the joint member 30. The diaphragm 13 is formed thin enough to perform a pressure transmission without causing a pressure loss. The pressure thus produced is received by the pressure receiving portion 14a of the pressure detection device 14 and an electrical signal output from the piezoresistive elements corresponding to a pressure received by the pressure receiving portion 14a is processed in the electronic circuit unit, thereby, the processed electrical signal is output to the plurality of lead pins 19 as a pressure signal.

The cover 40, for example, is configured in a cylindrical shape (including a substantially cylindrical shape) by synthetic resin such as polyphenylene ether (PPE) or the like as a material. Alternatively, the cover 40 may be configured with copper or copper alloy (brass, etc.) as a material. In the cover 40, an upper portion in the figure accommodating a connector 23 and the lead wire 24 of the electrical connection portion 20 is formed as a small diameter end portion 41, and a lower portion in the figure accommodating the pressure detection element 5 in the figure is formed as a large diameter end portion 42 (an one end portion of the cover 40) extending in a tubular skirt shape with rendering a diameter thereof greater than that of the small diameter end portion 41.

In an inner peripheral surface of the small diameter end portion 41, there is formed a protruding portion 41a that protrudes over the entire periphery thereof. The protruding portion 41a serves as a removal stopper of the first adhesive 51 filled up in a first space 47 in the cover 40, which will be described later.

On the inner peripheral side of the large diameter end portion 42, there is formed an annular step portion 42a having substantially the same diameter as the outer diameter of the base 11. On the annular step portion 42a, the base 11 is placed so as to engage therewith and be seated to fit thereinto at an annular corner 11e that is an outer diameter corner portion of the base 11. Thereby, the base 11 is placed on the annular step portion 42a so that the pressure detection element 5 (specifically, the case 10 consisted of the base 11 and the receiving member 12) is disposed so as to shut the opening of the large diameter end portion 42 in a downward location in the figure. At this time, the plurality of lead pins 19 projecting from the case 10 is arranged so as to be directed to the inside of the cover 40 (the small diameter end portion 41 side).

In a region in the inner periphery side of the large diameter end portion 42, which is positioned closer to the opening located downward in the figure than the annular step portion 42a, there is provided a cylindrical inner peripheral surface 42b, a diameter of which is greater than the outer diameter of the case 10 (specifically, the base 11). An annular gap 45 to be filled up by the second adhesive 52 that will be described later is formed over the entire circumference between the cylindrical inner peripheral surface 42b and the outer peripheral surface 10b of the case 10 (specifically, the outer peripheral surface 11f of the base 11 and the peripheral surface 12d of the receiving member 12). The annular gap 45 is located at the vicinity of the opening in a downward location in the figure of the lower large-diameter end section 42, and is continuous with an open space 46 that will be described later, constituting a second space 48.

The inside of the cover 40 is separated by the case 10 which is accommodated in the cover 40, and the first space 47 is formed on the small diameter end portion 41 side from the base body 11a of the base 11. In the first space 47, there is accommodated the electrical connection portion 20 (specifically, the substrate 21, the connector 23 and the lead wire 24).

In the first space 47, the first adhesive 51 is filled up and cured. For the first adhesive 51, for example, an epoxy-based adhesive having high adhesive property with the cover 40 and the lead wire 24, and having high elasticity, is used. Of course, the other types of adhesive (such as urethane-based adhesive, silicone-based adhesive, or the like) may be used for the first adhesive 51.

The first adhesive 51, by being cured after filling up the first space 47, the plurality of lead pins 19, the substrate 21, the connector 23 and the lead wire 24 are brought to in an embedded state to seal these parts within the cover 40. That is, the first adhesive 51 is joined to the upper end surface 10a of the case 10 so as to cover the plurality of lead pins 19.

In the vicinity of the opening of the large diameter end portion 42 of the cover 40 in a downward location in the figure, the second space 48 is formed. The second space 48 is configured by including the annular gap 45 and the open space 46.

The annular gap 45, as described above, is a relatively narrow annular space formed between the outer peripheral surface 10b of the case 10 and the cylindrical inner peripheral surface 42b of the large diameter end portion 42 that faces the outer peripheral surface 10b.

The open space 46 is a space continuous with the annular gap 45, and is a space surrounded by the annular lower surface 12e continuous with the peripheral surface 12d of the flange portion 12b of the receiving member 12, an outer tapered peripheral surface 12f continuous with the annular lower surface 12e, and, an opening end side portion of the cylindrical inner peripheral surface 42b of the large diameter end portion 42 and inclined end surface 42c continuous therewith.

In the second space 48, a second adhesive 52 is filled up. That is, a space where the second adhesive 52 is filled up in FIG. 12 is the second space 48. For the second adhesive 52, an epoxy-based adhesive having high adhesive property with respect to the receiving member 12 and the base 11 made of stainless steel, the joint member 30 made of copper, and the cover 40 made of synthetic resin and having high elasticity, is used. Alternatively, the second adhesive 52 may be urethane-based adhesive or silicone adhesive.

The second adhesive 52, by being filled up in the second space 48, is provided over the entire circumference between the case 10 of the pressure detection element 5 and the large diameter end portion 42 of the cover 40. Thus, the second adhesive 52, by being cured after filling up the second space 48, adheres between the case 10 and the cover 40 so as to seal over the entire circumference therebetween. As a result, a fixing strength between the case 10 and the cover 40 or a sealing performance therebetween is further enhanced.

The second adhesive 52 is joined to a portion of the outer peripheral surface 10b of the case 10 (a portion of the outer peripheral surface 11f of the base 11 and the peripheral surface 12d of the receiving member 12) and a portion of the lower end surface 10c of the case 10 (an annular lower surface 12e of the receiving member 12 and the outer tapered peripheral surface 12f). Further, the second adhesive 52 is joined to the inclined end surface 42c and a portion of the cylindrical inner peripheral surface 42b of the large-diameter end portion 42 of the cover 40.

Since the cover 40 is configured by using synthetic resin (or copper, copper alloy) as a material, a water-resistance property of the boundary face between the cover 40, and the first adhesive 51 and the second adhesive 52 (specifically, difficulty of intruding the moisture to the boundary face) is relatively high. Further, since the case 10 of the pressure detection element 5 is configured with stainless steel (or aluminum, nickel) as a material, a water-resistance property of the boundary face between the case 10, and the first adhesive 51 and the second adhesive 52 is low as compared to a water-resistance property of the boundary face between the cover 40, and the first adhesive 51 and the second adhesive 52. That is, since the moisture is more likely to intrude into the boundary face between the case 10, and the first adhesive 51 and the second adhesive 52 than the boundary face between the cover 40, and the first adhesive 51 and the second adhesive 52, it is necessary to improve a water-resistance property of the boundary face between the case 10, and the first adhesive 51 or the second adhesive 52 in order to enhance a waterproof property of the boundary face therebetween.

Here, the roughened surface portion 7 provided on the upper end surface 10a of the case 10 in the pressure detection element 5 is described.

The roughened surface portion 7 is formed in, as illustrated in FIGS. 13A and 13B, an annular shape in a plan view, and is provided so as to surround the plurality of lead pins 19 at a region where the first adhesive 51 is joined on the upper end surface 10a of the case 10. In other words, in view of a positional relationship with respect to the first adhesive 51 and the plurality of lead pins 19 on the outside side surface of the case 10 (a surface portion facing an outer side of the case 10, specifically, the upper end surface 10a, the outer peripheral surface 10b and the lower end surface 10c), the roughened surface portion 7 is annularly disposed at a region where the first adhesive 51 is joined on the outer periphery of the case 10 so as to partition between a peripheral edge 51a located on the upper end surface 10a in the first adhesive 51 and the plurality of lead pins 19. Thus, the moisture must pass through the roughened surface portion 7 at the boundary face between the upper end surface 10a of the case 10 and the first adhesive 51 in order to reach the plurality of lead pins 19 from the peripheral edge 51a.

The roughened surface portion 7 is formed by roughening the upper end surface 10a of the case 10 using a laser irradiation. Thus, the first adhesive 51 enters into the concave portions of the roughened surface portion 7 to improve an adhesion property between the upper end surface 10a and the first adhesive 51, whereby a water-resistance property of the boundary face with respect to the first adhesive 51 is enhanced.

In this embodiment, the roughened surface portion 7 is configured with, as illustrated in FIG. 13B, the plurality of grooves 8 formed linearly in parallel to each other. The plurality of grooves 8 is formed by performing laser scanning in plural times in a predetermined direction while shifting the laser irradiation position by a groove pitch. The depth of the plurality of grooves 8 ranges from 100 nm to 100 μm, preferably ranges from 0.5 μm to 3 μm, and more preferably ranges between 1 μm±0.5 μm.

Next, operations of the present invention of the pressure detection units 2 as described above will be described.

When the pressure detection unit 2 is exposed for a long period of time to a liquid such as water or the like, moisture enters into the boundary face between the lower end surface 10c of the case 10 and the second adhesive 52 from a region in a peripheral edge 52a located on the outside of the cover 40 and on the lower end surface 10c of the case 10 in the second adhesive 52. The moisture having entered into the boundary face is gradually transmitted to the lower end surface 10c of the case 10, to the outer peripheral surface 10b, and to the upper end surface 10a in a sequence.

Then, from a region in the peripheral edge 51a located on the upper end surface 10a of the case 10 in the first adhesive 51, moisture intrudes into the boundary face between the upper end surface 10a of the case 10 and the first adhesive 51. However, since the moisture having entered into the boundary face is prevented from progressing by the roughened surface portion 7, the moisture can be restrained from reaching the plurality of lead pins 19 surrounded by the roughened surface portion 7.

As described above, the pressure detection unit 2 of this embodiment includes (a) the pressure detection element 5 comprised of the case 10 made of stainless steel, the hermetic seal 16 provided in the case 10 and sealing the plurality of lead-pin-leading-out holes 11d penetrating the inside and the outside of the case 10, the pressure detection device 14 provided in the case 10, and the plurality of lead pins 19 electrically connected to the terminals of the pressure detection device 14 and provided so as to penetrate the hermetic seal 16 in the plurality of lead-pin-leading-out holes 11d; (b) the first adhesive 51 joined to the upper end surface 10a of the case 10 so as to cover the plurality of lead pins 19. Then, at a region where the first adhesive 51 is joined on the upper end surface 10a of the case 10, there is provided by using a laser irradiation, the annular roughened surface portion 7 being disposed so as to partition the plurality of lead pins 19 and the peripheral edge 51a located on the upper end surface 10a of the case 10 in the first adhesive 51.

Further, in the pressure detection unit 2, the roughened surface portion 7 is configured with the plurality of grooves 8 formed by performing laser scanning in plural times.

Further, in the pressure detection unit 2, the plurality of grooves 8 is formed linearly in parallel with each other.

As described above, according to this embodiment, at the upper end surface 10a of the case 10 made of stainless steel, there is joined the first adhesive 51 that covers the plurality of lead pins 19, and at a region where the first adhesive 51 is joined on the upper end surface 10a of the case 10, there is provided the annular roughened surface portion 7 being disposed so as to partition the plurality of lead pins 19 and the peripheral edge 51a located on the upper end surface 10a of the case 10. Thus, the moisture having entered into the boundary face between the upper end surface 10a of the case 10 and the first adhesive 51 from the peripheral edge 51a located on the upper end surface 10a of the case 10 must pass through the roughened surface portion 7 in order to reach the plurality of lead pins 19. Then, in the roughened surface portion 7, the first adhesive 51 enters into the concave portions caused by roughening using a laser irradiation, an adhesion property between the upper end surface 10a of the case 10 and the first adhesive 51 is improved, thereby, a water-resistance property of the boundary face between the roughened surface portion 7 of the case 10 and the first adhesive 51 is enhanced. Thus, in the roughened surface portion 7, the moisture is prevented from passing therethrough, and the moisture is restrained from reaching the plurality of lead pins 19, thereby, a waterproof property thereof is enhanced. Further, since the roughened surface portion 7 is formed by a laser irradiation, as compared to the case in which the roughened surface portion is formed, for example, by such as plasma cleaning or UV irradiation, the roughened surface portion 7 can be easily formed to a desired shape. Thus, the annular roughened surface portion 7 can be easily provided.

Further, since the roughened surface portion 7 is configured with the plurality of grooves 8 formed by performing laser scanning in plural times, the roughened surface portion 7 can be more easily formed by a simple laser control as compared to a laser control in which an intermittent laser irradiation is performed.

Further, since the plurality of grooves 8 in the roughened surface portion 7 is formed in parallel linearly to each other, the roughened surface portion 7 can be more easily formed using a very simple laser control.

Fourth Embodiment

Hereinafter, the pressure detection unit of the fourth embodiment of the present invention will be described with reference to FIGS. 14 and 15.

Figure 14:
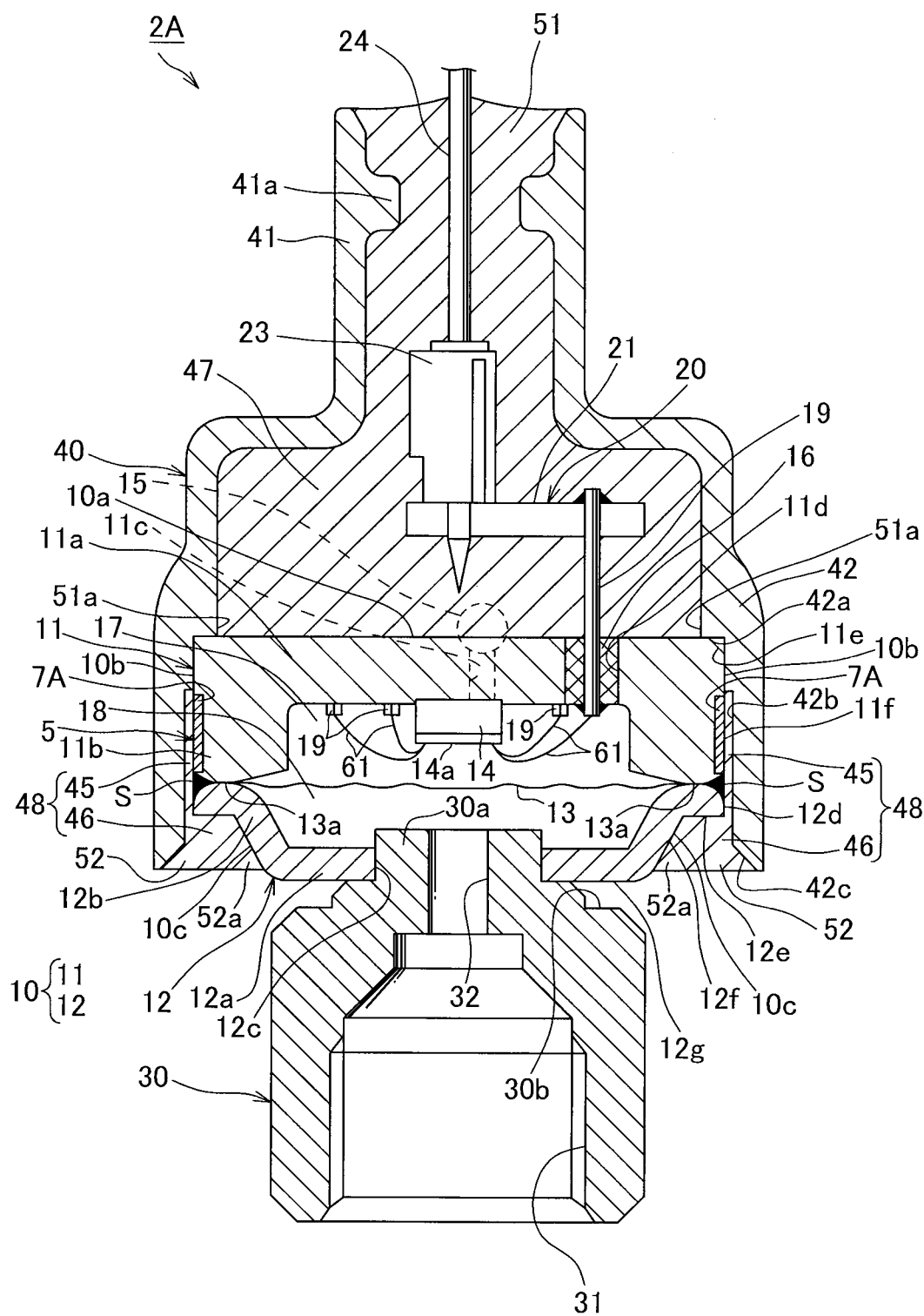
FIG. 14 is a diagram showing a longitudinal sectional view of a pressure detection unit of a fourth embodiment of the present invention.
Figure 15A:
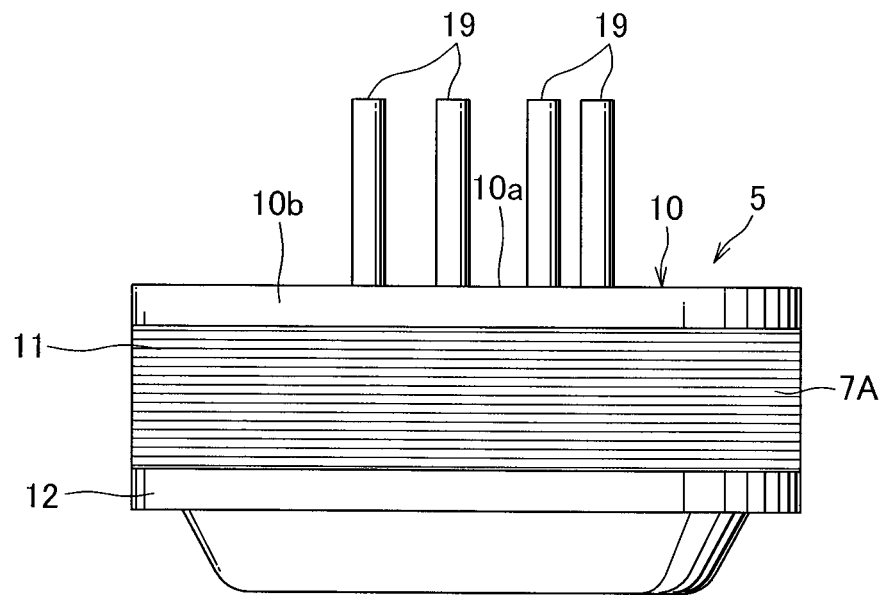
FIG. 15A is a side view of a pressure detection element provided in a pressure detection unit in FIG. 14.
Figure 15B:
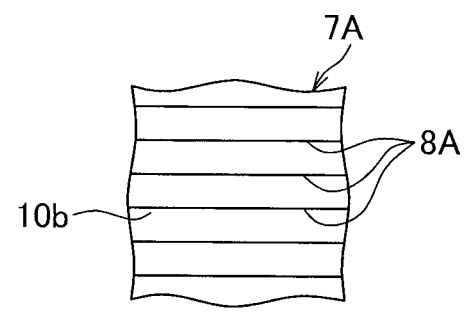
FIG. 15B is a partially enlarged view of a roughened surface portion in FIG. 15A (the roughened surface portion is configured with a plurality of grooves formed linearly in parallel to each other on an outer periphery surface of a case).

FIG. 14 is a diagram showing a longitudinal sectional view of the pressure detection unit of the fourth embodiment of the present invention. FIG. 15A is a side view of the pressure detection element provided in the pressure detection unit in FIG. 14, and FIG. 15B is a partially enlarged view of the roughened surface portion in FIG. 15A (the roughened surface portion is configured with the plurality of grooves formed linearly in parallel to each other on the outer periphery surface of the case). Note that a linguistic concept of "upper and lower" in the following description corresponds to vertical locations in FIG. 14 that shows a relative positional relationship of each member, but not shows an absolute positional relationship thereof.

The pressure detection unit shown in FIG. 14 (indicated by the reference number 2A in the figure), in a pressure detection unit 2 of the third embodiment as described above, includes the roughened surface portion 7A provided on the outer peripheral surface 10b of the case 10 in the pressure detection element 5 in place of the roughened surface portion 7 disposed on the upper end surface 10a of the case 10 in the pressure detection element 5. The rest of the configuration is the same as the third embodiment. Thus, in the following description, descriptions of the same portions as those of the pressure detection unit 2 of the third embodiment will be omitted by indicating the same reference numbers.

The roughened surface portion 7A is formed in, as shown in FIGS. 15A and 15B, an annular shape along a circumferential direction of the outer peripheral surface 10b of the case 10 in the pressure detection element 5. That is, in view of a positional relationship with respect to the second adhesive 52 and the plurality of lead pins 19 on the outside side surface of the case 10 (a surface portion facing an outer side of the case 10, specifically, the upper end surface 10a, the outer peripheral surface 10b and the lower end surface 10c), the roughened surface portion 7A is annularly disposed so as to partition between the peripheral edge 52a located on the outer surface (the lower end surface 10c) in the second adhesive 52 and located at the outside of the cover 40, and the plurality of lead pins 19. Thus, the moisture must pass through the roughened surface portion 7A at the boundary face between the outer peripheral surface 10b and the lower end surface 10c of the case 10 and the second adhesive 52 in order to reach the plurality of lead pins 19 from the peripheral edge 52a.

The roughened surface portion 7A is formed by roughening the outer peripheral surface 10b of the case 10 using a laser irradiation. Thus, the second adhesive 52 enters into the concave portions of the roughened surface portion 7A to improve an adhesion property between the outer peripheral surface 10b and the second adhesive 52, whereby a water-resistance property of the boundary face with respect to the second adhesive 52 is enhanced.

In this embodiment, the roughened surface portion 7A is configured with, as illustrated in FIG. 15B, the plurality of grooves 8A formed linearly (annually) in parallel to each other in the circumferential direction of the outer peripheral surface 10b of the case 10. The plurality of grooves 8A is formed by performing laser scanning in plural times in a direction intersecting the circumferential direction thereof while shifting the laser irradiation position by a groove pitch in the circumferential direction. That is, the plurality of grooves 8A is respectively formed in a concentric shape without intersecting with each other. The depth of the plurality of grooves 8A ranges from 100 nm to 100 μm, preferably ranges from 0.5 μm to 3 μm, and more preferably ranges between 1 μm±0.5 μm.

Next, operations of the present invention of the pressure detection units 2A as described above will be described.

When the pressure detection unit 2A is exposed for a long period of time to a liquid such as water or the like, moisture enters into the boundary face between the lower end surface 10c of the case 10 and the second adhesive 52 from a region in the peripheral edge 52a located on the lower end surface 10c of the case 10 in the second adhesive 52 and located at the outside of the cover 40. However, the moisture having entered into the boundary face, when transmitted to the outer peripheral surface 10b of the case 10, is prevented from progressing by the roughened surface portion 7A. Thus, the moisture does not proceed any further, thereby the moisture can be restrained from reaching up to the plurality of lead pins 19.

The pressure detection unit 2A of this embodiment includes: (a) the pressure detection element 5 comprised of the case 10 made of stainless steel, the hermetic seal 16 provided in the case 10 and sealing the plurality of lead-pin-leading-out holes 11d penetrating the inside and the outside of the case 10, the pressure detection device 14 provided in the case 10, and the plurality of lead pins 19 electrically connected to the terminals of the pressure detection device 14 and provided so as to penetrate the hermetic seal 16 in the plurality of lead-pin-leading-out holes 11d; (b) the cover 40 formed in a cylindrical shape and made of synthetic resin in which the pressure detection element 5 is accommodated with the plurality of lead pins 19 is directed to the cylindrical shape so as to shut the large-diameter end portion 42 that is the one end portion thereof; and (c) the second adhesive 52 provided over the entire circumference between the case 10 and the large diameter end portion 42 of the cover 40, and joined to the case 10 and the large diameter end portion 42 of the cover 40 so as to seal therebetween. Then, the pressure detection unit 2A is provided with the annular roughened surface portion 7A formed at a region where the second adhesive 52 is joined by a laser irradiation and disposed so as to partition the plurality of lead pins 19 and the peripheral edge 52a located on the outside side surface of the case 10 in the second adhesive 52 and located at the outside of the cover 40.

Further, in the pressure detection unit 2A, the roughened surface portion 7A is configured with the plurality of grooves 8A formed by performing laser scanning in plural times.

Further, in the pressure detection unit 2A, the plurality of grooves 8A is respectively formed in an annular shape, as well as is formed in a concentric shape without intersecting with each other.

According to the present embodiment as described above, the pressure detection element 5 is accommodated in the cover 40 formed in a cylindrical shape and made of synthetic resin so as to shut the large-diameter end portion 42 that is the one end portion thereof with the plurality of lead pins 19 are directed thereinto. The second adhesive 52 is provided over the entire circumference between the case 10 made of the stainless steel and the large diameter end portion 42 of the cover 40, and is respectively joined to the case 10 and the large diameter end portion 42 of the cover 40 so as to seal therebetween. Then, there is formed by using a laser irradiation, the annular roughened surface portion 7A partitioning the plurality of lead pins 19 and the peripheral edge 52a located on the outside side surface of the case 10 in the second adhesive 52 and located at the outside of the cover 40 at a region where the second adhesive 52 is joined on the outer side surface of the case 10. Thus, the moisture having entered into the boundary face between the case 10 and the second adhesive 52 from the peripheral edge 52a located on the outside side surface of the case 10 in the second adhesive 52 and located at the outside of the cover 40 must pass though the roughened surface portion 7A in order to reach the plurality of lead pins 19. Then, in the roughened surface portion 7A, the second adhesive 52 enters into the recesses caused by the roughening by a laser irradiation, thereby, the adhesion property between the case 10 and the second adhesive 52, and a water-resistance property at the boundary face between the second adhesive 52 and the roughened surface portion 7A of the case 10 is enhanced. Thus, in the roughened surface portion 7A, the moisture is prevented from passing therethrough and the moisture is restrained from reaching the plurality of lead pins 19, thereby enabling an enhancement of a waterproof property thereof.

Furthermore, since the roughened surface portion 7A is formed by a laser irradiation, as compared to the cases of forming the roughened surface portion, for example, by such methods as plasma cleaning or UV radiation, the roughened surface portion 7A can be easily formed to a desired shape. Thus, the annular roughened surface portion 7A can be easily provided.

Further, since the roughened surface portion 7A is configured with the plurality of grooves 8A formed by performing laser scanning in plural times, the roughened surface portion 7A can be more easily formed using a simple laser control as compared to a laser control in which an intermittent laser irradiation is performed.

Further, since the plurality of grooves 8A in the roughened surface portion 7A is respectively formed in a concentric shape without intersecting with each other, the plurality of grooves 8A serves as moats that oppose the moisture having intruded to the boundary face between the case 10 and the second adhesive 52 multiple times, to further restrain the moisture from reaching the plurality of lead pins 19, thereby further enabling an enhancement of a waterproof property thereof.

Fifth Embodiment

Figure 16:
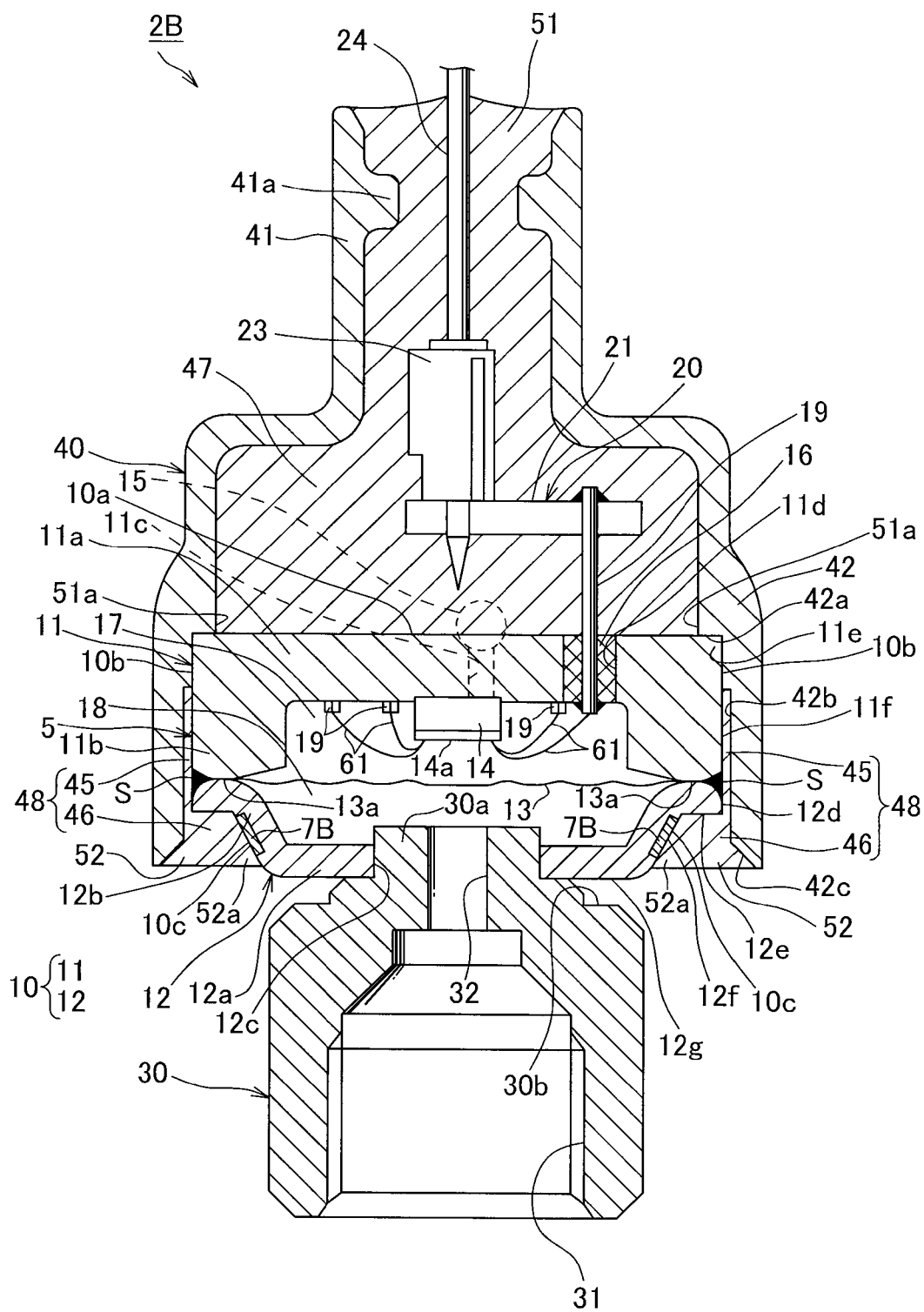
FIG. 16 is a diagram showing a longitudinal sectional view of a pressure detection unit of a fifth embodiment of the present invention.
Figure 17A:
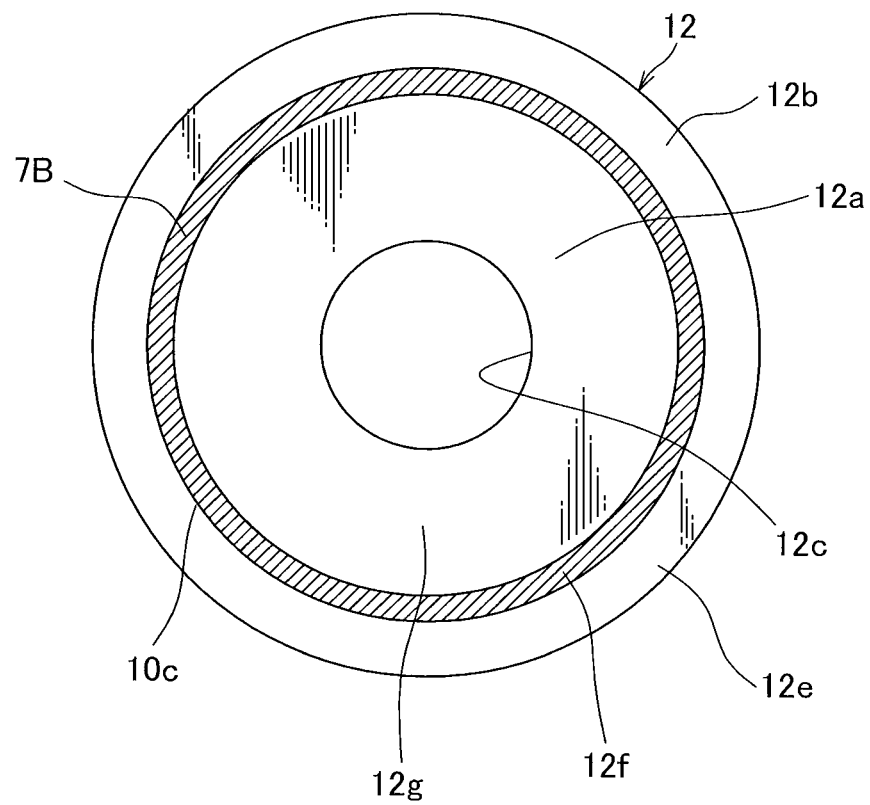
FIG. 17A is a plan view of a receiving member provided in a pressure detection unit in FIG. 16.

Hereinafter, the pressure detection unit of the fifth embodiment of the present invention will be described with reference to FIGS. 16 and 17. FIG. 16 is a diagram showing a longitudinal sectional view of the pressure detection unit of the fifth embodiment of the present invention. FIG. 17A is a plan view of the receiving member provided in the pressure detection unit in FIG. 16, and FIG. 17B is a partially enlarged view of the roughened surface portion in FIG. 17A (the roughened surface portion is configured with the plurality of grooves formed linearly in parallel to each other on the lower end surface of the case). Note that a linguistic concept of "upper and lower" in the following description corresponds to vertical locations in FIG. 16 that shows a relative positional relationship of each member, but not shows an absolute positional relationship thereof.

The pressure detection unit shown in FIG. 16 (indicated by the reference number 2B in the figure), in the pressure detection unit 2 of the third embodiment as described above, includes the roughened surface portion 7B provided on the lower end surface 10c (specifically, the outer tapered peripheral surface 12f of the receiving member 12) of the case 10 in the pressure detection element 5 in place of the roughened surface portion 7 provided on the upper end surface 10a of the case 10 in the pressure detection element 5. The rest of the configuration is the same as the third embodiment. Thus, in the following description, the same portions as those of the pressure detection unit 2 of the third embodiment will be omitted to describe by indicating the same reference numbers.

Figure 17B:
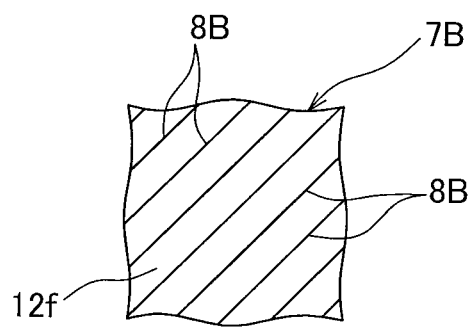
FIG. 17B is a partially enlarged view of a roughened surface portion in FIG. 17A (the roughened surface portion is configured with a plurality of grooves formed linearly in parallel to each other on a lower end surface of a case).

The roughened surface portion 7B is formed in as shown in FIGS. 17A and 17B, an annular shape along a circumferential direction in the lower end surface 10c (specifically, the outer tapered peripheral surface 12f of the receiving member 12) of the case 10 in the pressure detection element 5. That is, in view of a positional relationship with respect to the second adhesive 52 and the plurality of lead pins 19 on the outside side surface of the case 10 (a surface portion facing an outer side of the case 10, specifically, the upper end surface 10a, the outer peripheral surface 10b and the lower end surface 10c), the roughened surface portion 7B is annularly disposed so as to partition between the plurality of lead pins 19 and the peripheral edge 52a located on the outer surface (the lower end surface 10c) in the second adhesive 52 and located at the outside of the cover 40. Thus, the moisture must pass through the roughened surface portion 7B at the boundary face between the outer peripheral surface 10b and the lower end surface 10c of the case 10 and the second adhesive 52 in order to reach the plurality of lead pins 19 from the peripheral edge 52a.

The roughened surface portion 7B is formed by roughening the lower end surface 10c (specifically, the outer tapered peripheral surface 12f of the receiving member 12) of the case 10 using a laser irradiation. Thus, the second adhesive 52 enters into the concave portions of the roughened surface portion 7 B to improve an adhesion property between the lower end surface 10c and the second adhesive 52, whereby a water-resistance property of the boundary face with respect to the second adhesive 52 is enhanced.

In this embodiment, the roughened surface portion 7B is configured with, as illustrated in FIG. 17B, the plurality of grooves 8B formed linearly in parallel to each other. The plurality of grooves 8B is formed by performing laser scanning in plural times in a predetermined direction while shifting the laser irradiation position by a groove pitch. The depth of the plurality of grooves 8B ranges from 100 nm to 100 μm, preferably ranges from 0.5 μm to 3 μm, and more preferably ranges between 1 μm±0.5 μm.

Next, operations of the present invention of the pressure detection units 2B as described above will be described.

When the pressure detection unit 2B is exposed to a liquid such as water or the like for a long period of time, moisture enters into the boundary face between the lower end surface 10c of the case 10 and the second adhesive 52 from a region of the peripheral edge 52a located on the lower end surface 10c of the case 10 in the second adhesive 52 and located at the outside of the cover 40. However, the moisture having entered into the boundary face is prevented from progressing by the roughened surface portion 7B of the case 10. Thus, the moisture does not proceed any further, thereby the moisture can be restrained from reaching up to the plurality of lead pins 19.

The pressure detection unit 2B of this embodiment includes: (a) the pressure detection element 5 comprised of the case 10 made of stainless steel, the hermetic seal 16 provided in the case 10 and sealing the plurality of lead-pin-leading-out holes 11d penetrating the inside and the outside of the case 10, the pressure detection device 14 provided in the case 10, and the plurality of lead pins 19 electrically connected to the terminals of the pressure detection device 14 and provided so as to penetrate the hermetic seal 16 in the plurality of lead-pin-leading-out holes 11d; (b) the cover 40 formed in a cylindrical shape and made of synthetic resin in which the pressure detection element 5 being with the plurality of lead pins 19 is directed to the cylindrical shape so as to shut the large-diameter end portion 42 that is the one end portion thereof, is accommodated; and (c) the second adhesive 52 provided over the entire circumference between the case 10 and the large diameter end portion 42 of the cover 40, and joined to the case 10 and the large diameter end portion 42 of the cover 40 so as to seal therebetween. Then, the pressure detection unit 2B is provided with the annular roughened surface portion 7B formed at a region where the second adhesive 52 is joined by a laser irradiation and disposed so as to partition the plurality of lead pins 19 and the peripheral edge 52a located on the outside side surface of the case 10 in the second adhesive 52 and located at the outside of the cover 40.

Further, in the pressure detection unit 2B, the annular roughened surface portion 7B is configured with the plurality of grooves 8B formed by performing laser scanning in plural times.

According to the present embodiment as described above, the pressure detection element 5 is accommodated in the cover 40 formed in a cylindrical shape and made of synthetic resin so as to shut the large-diameter end portion 42 that is the one end portion thereof with the plurality of lead pins 19 being directed thereinto. The second adhesive 52 is provided over the entire circumference between the case 10 made of the stainless steel and the large diameter end portion 42 of the cover 40, and respectively joined to the case 10 and the large diameter end portion 42 of the cover 40 so as to seal therebetween. Then, there is formed by using a laser irradiation, the annular roughened surface portion 7B partitioning the plurality of lead pins 19 and the peripheral edge 52a located on the outside side surface of the case 10 in the second adhesive 52 and located at the outside of the cover 40 at a region where the second adhesive 52 is joined in the outer side surface of the case 10. Thus, the moisture having entered into the boundary face between the case 10 and the second adhesive 52 from the peripheral edge 52a located on the outside side surface of the case 10 in the second adhesive 52 and located at the outside of the cover 40 must pass though the roughened surface portion 7B in order to reach the plurality of lead pins 19. Then, in the roughened surface portion 7B, the second adhesive 52 enters into recesses formed by the roughening by a laser irradiation, and an adhesion property between the case 10 and the second adhesive 52 is enhanced, thereby, a water-resistance property at the boundary face between the roughened surface portion 7B of the case 10 and the second adhesive 52 is enhanced. Thus, in the roughened surface portion 7B, the moisture is prevented from passing therethrough and the moisture is restrained from reaching the plurality of lead pins 19, thereby enabling an enhancement of a waterproof property thereof. Furthermore, since the roughened surface portion 7B is formed by a laser irradiation, as compared to the cases of forming the roughened surface portion by such methods as plasma cleaning or UV radiation, for example, the roughened surface portion 7B can be easily formed to a desired shape. Thus, the annular roughened surface portion 7B can be easily provided.

Further, since the roughened surface portion 7B is configured with the plurality of grooves 8B formed by performing laser scanning in plural times, the roughened surface portion 7B can be more easily formed using a simple laser control as compared to a laser control in which an intermittent laser irradiation is performed.

Although the present invention has been described as the above with reference to the third embodiment, the fourth embodiment and the fifth embodiment as preferable embodiments, the pressure detection unit of the present invention is not limited to the configurations of these embodiments.

Figure 18A:
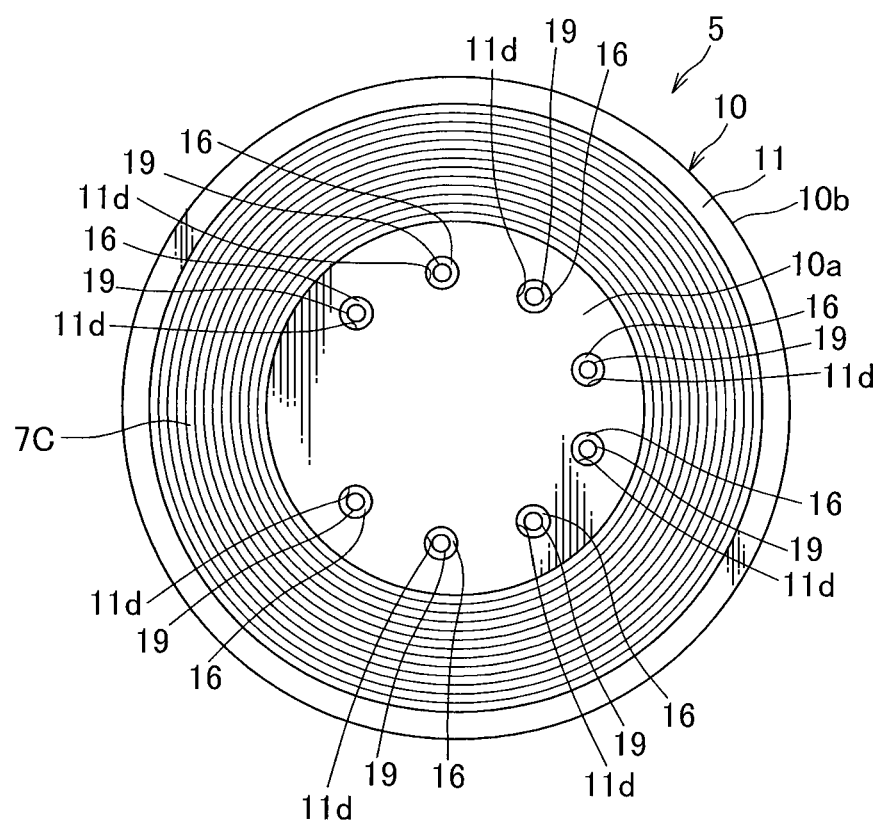
FIG. 18A is a plan view showing a structure of a first variation of a pressure detection element provided in the pressure detection element in FIGS. 13A and 13B.
Figure 18B:
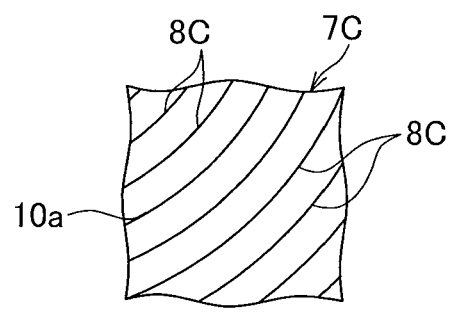
FIG. 18B is a partially enlarged view of a roughened surface portion in FIG. 18A (the roughened surface portion is constituted with a plurality of concentric grooves formed on an upper surface of an element main body).

For example, in the third embodiment as described above, although the roughened surface portion 7 is configured with the plurality of grooves 8 formed linearly in parallel to each other, the present invention is not limited thereto. In place of such roughened surface portion 7, as illustrated in FIGS. 18A and 18B, a configuration having the annular roughened surface portion 7C configured with the plurality of grooves 8C formed in an annular shape and in a concentric shape without intersecting with each other surrounding the plurality of lead pins 19, may also be employed. Due to such configuration, the plurality of grooves 8C serves as moats that oppose the moisture having intruded to the boundary face between the upper end surface 10a of the case 10 and the first adhesive 51 multiple times, to further restrain the moisture from reaching the plurality of lead pins 19, thereby further enabling an enhancement of a waterproof property thereof.

Figure 19A:
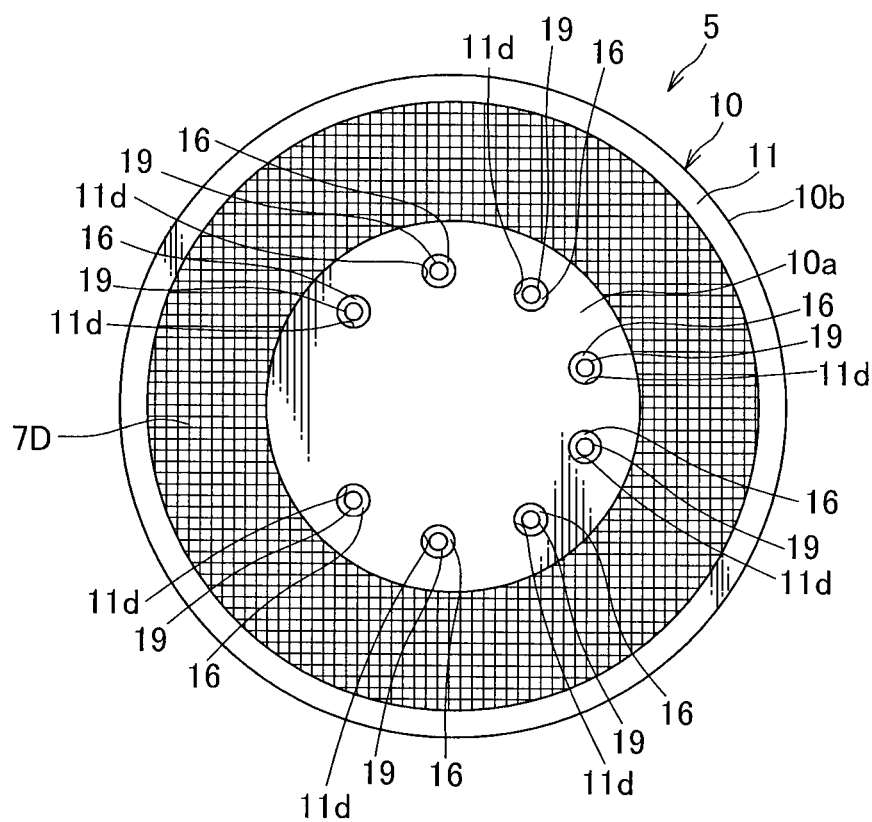
FIG. 19A is a plan view showing a configuration of a second variation of a pressure detection element provided in the pressure sensor in FIGS. 13A and 13B.
Figure 19B:
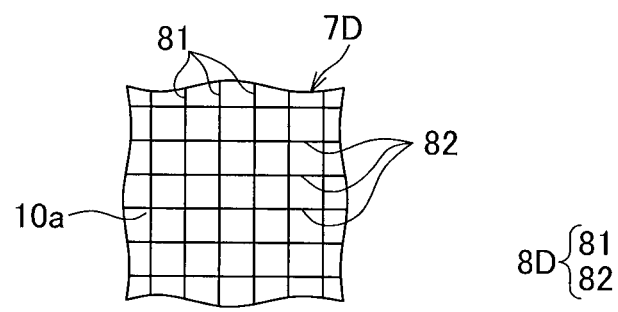
FIG. 19B is a partially enlarged view of a roughened surface portion (the roughened surface portion is constituted with a first plurality of grooves formed linearly on an upper surface of a case in parallel to each other in an one direction, and a second plurality of grooves formed linearly in an other direction intersecting to the one direction).

Alternatively, in place of the roughened surface portion 7 thus configured, as illustrated in FIGS. 19A and 19B, a configuration that includes a roughened surface portion 7D configured with a plurality of grooves 8D comprised of the first plurality of groove portions 81 formed linearly in parallel to each other and the second plurality of groove portions 82 formed linearly in parallel to each other intersecting with the first plurality of groove portions 81, may also be employed. Thereby, the roughened surface portion 7D having more improved waterproof function can be more easily formed by using a simple laser control.

Alternatively, in place of the roughened surface portion 7 thus configured, a roughened surface portion configured with a plurality of polka-dot patterned holes arranged apart from each other formed by a laser irradiation may also be employed.

In the fifth embodiment as described above, the configurations shown as the modified exemplifications in the third embodiment may also be employed.

Alternatively, in the fourth embodiment as described above, providing the plurality of grooves 8, 8D as illustrated in FIGS. 13B and 19B in place of the plurality of grooves 8A in the roughened surface portion 7A, may also be employed.

Also, in the third embodiment and in the fifth embodiment as described above, the roughened surface portion 7 is formed in a circular-ring-like shape in a plan view, and in the fourth embodiment, the roughened surface portion 7A is formed in a cylindrical-ring-like shape, the present invention is not limited thereto. For example, a roughened surface portion formed in a rectangular ring-like shape surrounding the plurality of lead pins 19 may be provided on the upper end surface 10a of the case 10 in place of the roughened surface portion 7 formed in a circular ring-like shape. Alternatively, in a configuration where the entire of the upper end surface 10a and the outer peripheral surface 10b of the case 10 is covered with a single adhesive, a roughened surface portion may be configured in a ring-like shape surrounding the plurality of lead pins 19 across the upper end surface 10a and the outer peripheral surface 10b. Unless contrary to the objectives of the present invention, the roughened surface portion may be formed in a ring-like shape partitioning a peripheral edge on a peripheral surface in an adhesive and a plurality of lead pins such that the roughened surface portion must be passed through when being moved from the peripheral edge on a peripheral surface in an adhesive to the plurality of lead pins.

Further, although a configuration in which the pressure detection element 5 and the electrical connection portion 20 is accommodated in the cover 40 is employed in the third embodiment, the fourth embodiment and the fifth embodiment as described above, the present invention is not limited thereto. For example, a configuration in which a single adhesive covers the pressure detection element 5 and the electrical connection portion 20 without providing the cover 40 therewith, may be employed. In this case, the adhesive may be provided in a manner being joined to the outside side surface of the case 10 so as to cover at least the plurality of lead pins 19 of the pressure detection element 5. Also, the roughened surface portion may be formed in an annular shape by a laser irradiation at a region where the adhesive is joined on an outside side surface of the case 10 so as to be disposed in a manner partitioning the peripheral edge on an outer peripheral portion of the case 10 in the adhesive, and the plurality of lead pins 19.

Note that the first to fifth embodiments as described above show a representative embodiment of the present invention, and the present invention is not limited to the embodiments. That is, the person skilled in the art, according to conventional known knowledge, can carry out in various modifications without departing from the scope of the present invention. As long as the modifications include a configuration of the pressure detection unit of the present invention, needless to say, they are within the scope of the present invention.

(Evaluation)

The inventors have manufactured the pressure detection units shown in the following Examples 1 to 5 and Comparative Example 1, and have conducted the following evaluating experiments using these pressure detection units to confirm the effects provided by the present invention.

Example 1

In the pressure detection unit 2 of the third embodiment as described above, a sample having the annular roughened surface portion 7 surrounding the plurality of lead pins 19 was manufactured as Example 1; the annular roughened surface portion 7 being configured with the plurality of grooves 8 linearly formed in parallel to each other on the upper end surface 10a of the case 10, which is illustrated in FIGS. 13A and 13B; the sample being manufactured under the following experimental conditions: the laser power at 80% (the average laser output is 13 W); the scanning speed (scan speed) at 500 mm/sec; the irradiation frequency at 20 kHz; the scanning interval (pitch) at 100 μm; the laser spot diameter at 40 μm; and the laser focus (focus) at ±0 μm. In Example 1, as for the plurality of grooves, the average width value thereof was 67.1 μm.

Example 2

In the first embodiment, in place of the roughened surface portion 7, a sample having the annular roughened surface portion 7C surrounding the plurality of lead pins 19 was manufactured as Example 2; the annular roughened surface portion 7C being configured with the plurality of grooves 8C respectively formed in annular shape without intersecting with each other on the upper end surface 10a of the case 10, which is illustrated in FIGS. 18A and 18B. The rest of the configuration thereof is the same as Example 1. In Example 2, as for the plurality of grooves, the average width value thereof was 67.1 μm.

Example 3

In the first embodiment, in place of the roughened surface portion 7, a sample having the annular roughened surface portion 7D surrounding the plurality of lead pins 19 was manufactured as Example 3; the annular roughened surface portion 7D being configured with the plurality of grooves 8D including the plurality of groove portions 81 formed linearly in parallel to each other, and the plurality of groove portions 82 formed linearly in parallel to each other in a direction intersecting with the plurality of groove portions 81, which is illustrated in FIGS. 19A and 19B. The sample was manufactured under the experimental conditions of the laser power at 100% and the scanning interval (pitch) at 300 μm. The rest of the configuration thereof is the same as Example 1. In Example 3, as for the plurality of grooves, the average width value thereof was 77.6 μm.

Example 4

In the first embodiment, in place of the roughened surface portion 7, a sample having the annular roughened surface portion 7C surrounding the plurality of lead pins 19 was manufactured as Example 4; the annular roughened surface portion 7C being configured with the plurality of grooves 8C including the plurality of groove portions 81 formed linearly in parallel to each other, and the plurality of groove portions 82 formed linearly in parallel to each other in a direction intersecting with the plurality of groove portions 81, which is illustrated in FIGS. 19A and 19B. The sample was manufactured under the following experimental conditions: the laser power at 50%; the irradiation frequency at 10 kHz; the scanning interval (pitch) at 20 μm; and the laser focus (focus) at +20 μm. The rest of the configuration thereof is the same as Example 1. In Example 4, as for the plurality of grooves, the average width value thereof was 50.3 μm.

Example 5

In the pressure detection unit 2A of the second embodiment as described above, a sample having the roughened surface portion 7A configured with the plurality of grooves 8A was manufactured as Example 5; the roughened surface portion 7A being configured with the plurality of grooves 8A formed linearly (annually) in parallel to each other on the outer peripheral surface 10b of the case 10, which is illustrated in FIGS. 15A and 15B. The sample was manufactured under the following experimental conditions: the laser power at 80% (the average laser output is 13 W); the scanning speed (scan speed) at 500 mm/sec; the irradiation frequency at 20 kHz; the scanning interval (pitch) at 100 μm; the laser spot diameter at 40 μm; and the laser focus (focus) at ±0 μm. In Example 5, as for the plurality of grooves, the average width value thereof was 67.1 μm.

those were observed after decomposing them. The evaluations thereof were conducted in accordance with the following appraisal standards:

○: Water has not reached up to the plurality of lead pins 19.

x: Water has reached up to the plurality of lead pins 19.

(Comprehensive Evaluation)

On the basis of the results of Tests 1 to 3, a waterproof evaluation was conducted comprehensively in accordance with the following appraisal standards:

○: Water has not reached up to the plurality of lead pins 19 in all the experiments.

x: Water has reached up to the plurality of lead pins 19 in at least one of the experiments.

The configurations and the evaluation results of the above Examples 1 to 5 and Comparative Example 1 are listed in Table 1.

TABLE 1

Figure 20:
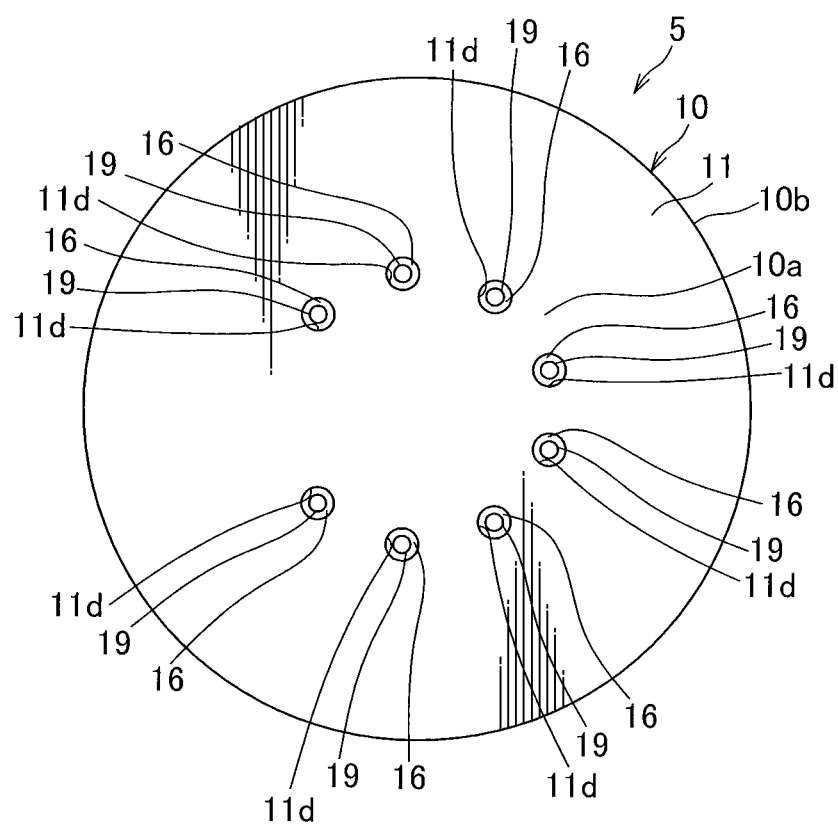
FIG. 20 is a plan view showing a structure in which a roughened surface portion is omitted in the pressure detection element in FIG. 13A.
Figure 21:
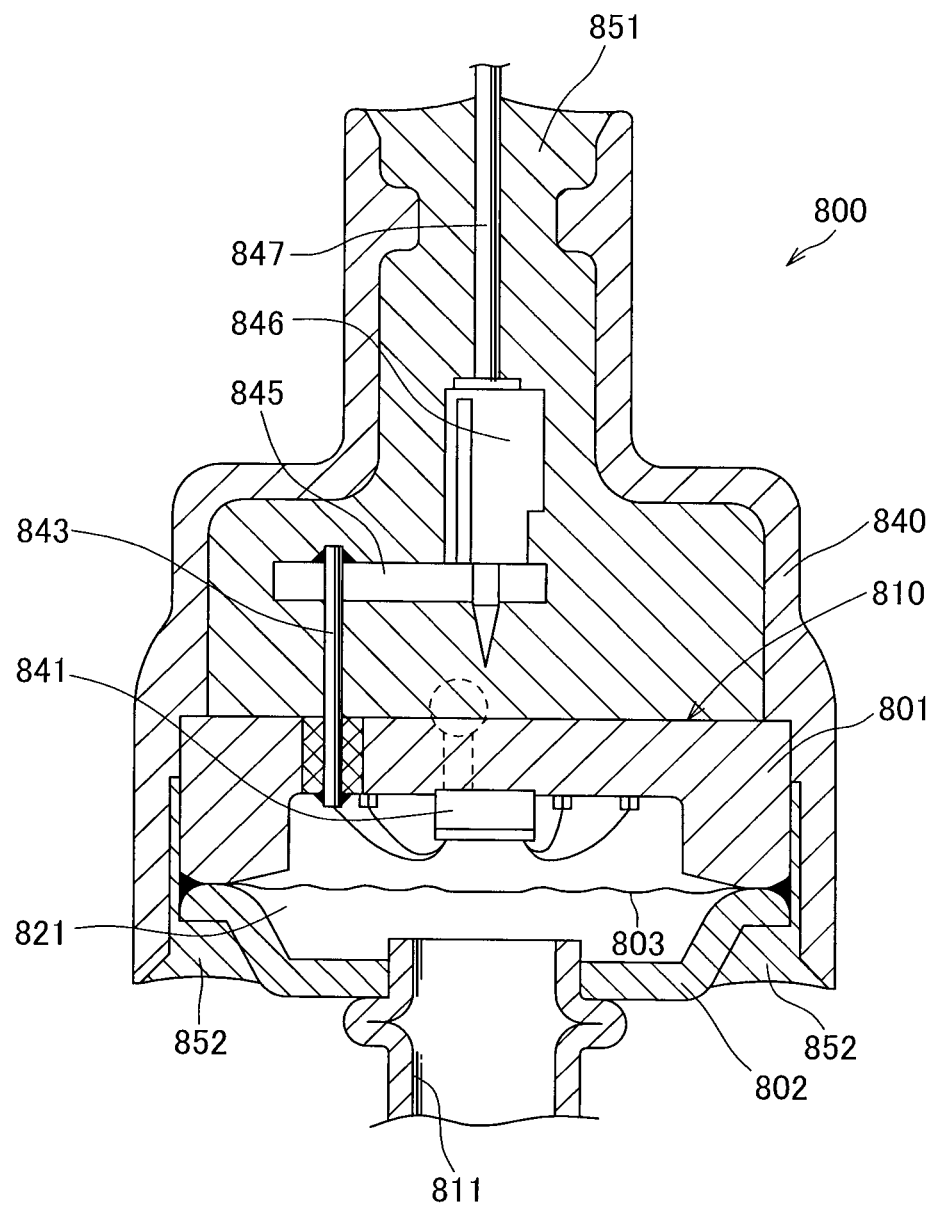
FIG. 21 is a longitudinal sectional view showing a conventional pressure detection unit.

| | Configuration of Roughened portion | Power [%] | Scanning Speed [mm/sec] | Frequency [kHz] | Pitch [μm] | Spot Diameter [μm] | Focus [μm] | Average Width Value of Groove | Test 1 | Test 2 | Test 3 | Comprehensive Evaluation |
|---|---|---|---|---|---|---|---|---|---|---|---|---|
| Example 1 | FIG. 13 | 80 | 500 | 20 | 100 | 40 | ±0 | 67.1 | ○ | ○ | ○ | ○ |
| Example 2 | FIG. 18 | 80 | 500 | 20 | 100 | 40 | ±0 | 67.1 | ○ | ○ | ○ | ○ |
| Example 3 | FIG. 19 | 100 | 500 | 20 | 300 | 40 | ±0 | 77.6 | ○ | ○ | ○ | ○ |
| Example 4 | FIG. 19 | 50 | 500 | 10 | 20 | 40 | +20 | 50.3 | ○ | ○ | ○ | ○ |
| Example 5 | FIG. 15 | 80 | 500 | 20 | 100 | 40 | ±0 | 67.1 | ○ | ○ | ○ | ○ |
| Comparative Example 1 | FIG. 20 | N/A | N/A | N/A | N/A | N/A | N/A | N/A | x | x | x | x |

Comparative Example 1

In Example 1, as shown in FIG. 20, a sample in which the roughened surface portion 7 is omitted and the rest of the configuration thereof is the same as Example 1, was manufactured as Comparative Example 1.

(Test 1: Experiment of Left Standing in Water)

The samples in the above Examples 1 to 5 and Comparative Example 1 were placed in a water bath and were subjected to a soaking for 120 hours at 80 degrees water, and subsequently the water-immersion conditions of the inside of those were observed after decomposing them. The evaluations thereof were conducted in accordance with the following appraisal standards:

○: Water has not reached up to the plurality of lead pins 19.

x: Water has reached up to the plurality of lead pins 19.

(Test 2: Heat Shock Experiment in Water)

The samples in the above Examples 1 to 5 and Comparative Example 1 were placed in a water bath, the water temperature thereof was changed periodically in plural times (30 times) within 0 to 80 degrees in a state being immersed in water and subsequently the water-immersion conditions of the inside of those were observed after decomposing them. The evaluations thereof were conducted in accordance with the following appraisal standards:

○: Water has not reached up to the plurality of lead pins 19.

x: Water has reached up to the plurality of lead pins 19.

(Test 3: Heat Shock Experiment in Air)

The samples in the above Examples 1 to 5 and Comparative Example 1 were placed in a thermostatic bath, the air temperature therearound was changed periodically in plural times (100 times) within −40 to 135 degrees. Thereafter, the samples were immersed in water for 24 hours and subsequently the water-immersion conditions of the inside of (Discussion)

As shown in Table 1, in Comparative Example 1 in which the roughened surface portion was not provided, moisture has intruded to the plurality of lead pins 19 in all the experiments. In contrast, in Examples 1 to 5, in which the roughened surface portion was provided, moisture has not intruded to the plurality of lead pins 19 in all the experiments. In view of the results, it could be observed that providing the roughened surface portions enables an improvement of waterproof property. Also, in the actual evaluation experiment in which the pressure detection units were used in practice, the effect of the present invention could be confirmed. Incidentally, in view of the evaluation results, it can be considered that the same effects would also be observed with the pressure sensor 1 of the first embodiment and the pressure sensor 1A of the second embodiment.

| Reference Signs List | |
|---|---|
| (FIGS. 1 to 11) | |
| 1, 1A | pressure sensor (pressure detection unit) |
| 7, 7A, 7B, 7C | roughened surface portion |
| 8, 8A, 8B, 8C, 81, 82 | plurality of grooves |
| 14 | joint member |
| 16 | pressure detection element |
| 18 | element main body (case) |
| 18a | upper end surface of the case (outside side surface) |
| 18 | outer peripheral surface of the case (outside side surface) |
| 18c | lower end surface of the case (outside side surface) |
| 20 | central opening (through-hole) |
| 22 | hermetic glass (insulating member) |
| 24 | diaphragm |
| 30 | liquid sealing chamber |
| 32 | sensor chip (pressure detection device) |
| 34 | lead pin |

| Reference Signs List | |
|---|---|
| 36 | wire |
| 38 | terminal block |
| 54 | lid member |
| 62 | external lead wire |
| 66 | cover member |
| 68 | sealed resin portion (adhesive) |
| 68a | outer peripheral edge (outer peripheral edge on outside side surface of case in adhesive) |
| 68b | inner peripheral edge (inner peripheral edge on outside side surface of case in adhesive) |
| | (FIGS. 12 to 19) |
| 2, 2A, 2B | pressure detection unit |
| 5 | pressure detection element |
| 7, 7A, 7B, 7C, 7D | roughened surface portion |
| 8, 8A, 8B, 8C, 8D, 81, 82 | plurality of grooves |
| 10 | case |
| 10a | upper end surface of case (outside side surface) |
| 10b | outer periphery surface of case (outside side surface) |
| 10c | lower end surface of case (outside side surface) |
| 11 | base |
| 11d | lead-pin-leading-out hole (through-hole) |
| 12 | receiving member |
| 13 | diaphragm |
| 14 | pressure detection device |
| 16 | hermetic seal (insulating member) |
| 17 | receiving space |
| 18 | pressurized air space |
| 19 | lead pin |
| 20 | electrical connection portion |
| 40 | cover |
| 41 | small diameter end portion |
| 42 | large diameter end portion (one end of cover) |
| 45 | annular gap |
| 46 | open space |
| 47 | first space |
| 48 | second space |
| 51 | first adhesive (adhesive) |
| 51a | peripheral edge of first adhesive (peripheral edge on outside side surface of case in the adhesive) |
| 52 | second adhesive (adhesive) |
| 52a | peripheral edge of second adhesive (peripheral edge of outside side surface of case in adhesive and located at outside of cover) |

The invention claimed is:

1. A pressure detection unit comprising: (a) a pressure detection element comprised of a case having an upper end surface and an outer peripheral surface facing in a different direction than the upper end surface, the case being made of stainless steel, aluminum or nickel, an insulating member provided in the case and sealing an one or more through-hole(s) penetrating the case, a pressure detection device provided inside of the case, and a plurality of lead pins electrically connected to terminals of the pressure detection device and provided in the through-hole(s) in a manner penetrating the insulating member; (b) a cover cylindrically formed and accommodating the pressure detection element; (c) a joint member closing an end portion of the cover; and (d) an adhesive provided inside of the cover, and joined to an outside side surface of the case in a manner surrounding the plurality of lead pins, wherein a roughened annular surface portion is formed at a region where the adhesive is joined on the outer peripheral surface facing in the different direction than the upper end surface of the case, and wherein the roughened surface portion is configured with a plurality of grooves formed by performing laser scanning, and wherein the grooves are formed linearly in parallel to each other, or, the grooves are comprised of a first plurality of groove portions formed linearly in parallel to each other and a second plurality of groove portions formed linearly in parallel to each other in a direction intersecting with the first plurality of groove portions.

2. A pressure detection unit comprising: (a) a pressure detection element comprised of a case having an upper end surface and an outer peripheral surface facing in a different direction than the upper end surface, the case being made of stainless steel, aluminum or nickel, an insulating member provided in the case and sealing an one or more through-hole(s) penetrating an inside and an outside of the case, a pressure detection device provided inside of the case, and a plurality of lead pins electrically connected to terminals of the pressure detection device and provided in the through-hole(s) in a manner penetrating the insulating member; (b) a cover cylindrically formed and accommodating the pressure detection element with the plurality of lead pins being directed to an inside of the cylindrical shape in a manner closing an end portion of the cover; and (c) an adhesive provided inside of the cover, and joined to an outside side surface of the case in a manner surrounding the plurality of lead pins, wherein a roughened annular surface portion is formed at a region where the adhesive is joined on the outer peripheral surface facing in the different direction than the upper end surface of the case, and wherein the roughened surface portion is configured with a plurality of grooves formed by performing laser scanning, and wherein the grooves are formed linearly in parallel to each other, or, the grooves are comprised of a first plurality of groove portions formed linearly in parallel to each other and a second plurality of groove portions formed linearly in parallel to each other in a direction intersecting with the first plurality of groove portions.

3. A pressure detection unit comprising: (a) a pressure detection element comprised of a case having an upper end surface and an outer peripheral surface facing in a different direction than the upper end surface, the case being made of stainless steel, aluminum or nickel, an insulating member provided in the case and sealing an one or more through-hole(s) penetrating an inside and an outside of the case, a pressure detection device provided inside of the case, and a plurality of lead pins electrically connected to terminals of the pressure detection device and provided in a manner penetrating the insulating member in the through-hole(s); (b) a cover cylindrically formed and made of copper, copper alloy, or synthetic resin and accommodating the pressure detection element with the plurality of lead pins being directed to an inside of the cylindrical shape in a manner closing an end portion of the cover; (c) a first adhesive provided inside of the cover, and joined to an outside side surface of the case in a manner surrounding the plurality of lead pins, and (d) a second adhesive provided over an entire circumference between the case and an one end portion of the cover and respectively joined to the case and the one end portion of the cover so as to seal therebetween, wherein a roughened annular surface portion is formed at a region either: 1) where the second adhesive is joined on the outer peripheral surface facing in the different direction than the upper end surface of the case; or 2) where the second adhesive is joined on an outer tapered peripheral surface of a receiving member of the case, and wherein the roughened surface portion is configured with a plurality of grooves formed by performing laser scanning, and wherein the grooves are formed linearly in parallel to each other, or, the grooves are comprised of a first plurality of groove portions formed linearly in parallel to each other and a second plurality of groove portions formed linearly in parallel to each other in a direction intersecting with the first plurality of groove portions.

4. The pressure detection unit according to claim 1, wherein the roughened annular surface portion extends circumferentially about an axis and the outer peripheral surface of the case faces radially outwardly relative to the axis.

* * * * *